United States Patent
Tsunami

(10) Patent No.: US 11,121,034 B2
(45) Date of Patent: Sep. 14, 2021

(54) SEMICONDUCTOR DEVICE MANUFACTURING METHOD AND SEMICONDUCTOR DEVICE

(71) Applicant: Mitsubishi Electric Corporation, Tokyo (JP)

(72) Inventor: Daisuke Tsunami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/472,082

(22) PCT Filed: Mar. 24, 2017

(86) PCT No.: PCT/JP2017/012100
§ 371 (c)(1),
(2) Date: Jun. 20, 2019

(87) PCT Pub. No.: WO2018/173275
PCT Pub. Date: Sep. 27, 2018

(65) Prior Publication Data
US 2020/0098634 A1    Mar. 26, 2020

(51) Int. Cl.
*H01L 21/768* (2006.01)
*H01L 21/308* (2006.01)
(Continued)

(52) U.S. Cl.
CPC ...... *H01L 21/76898* (2013.01); *H01L 23/481* (2013.01)

(58) Field of Classification Search
CPC .................................................. H01L 21/76898
See application file for complete search history.

(56) References Cited

U.S. PATENT DOCUMENTS 5,893,757 A    4/1999    Su et al.
2009/0022885 A1*    1/2009    Matsumoto ......... C23C 18/2086
427/98.5
(Continued)

FOREIGN PATENT DOCUMENTS

JP    H10-214826 A    8/1998
JP    2006-228951 A    8/2006
(Continued)

OTHER PUBLICATIONS

Google Patent Translation of JP 2007311385 A (Year: 2007).*
(Continued)

*Primary Examiner* — Omar F Mojaddedi
(74) *Attorney, Agent, or Firm* — Studebaker & Brackett PC

(57) ABSTRACT

There is provided a method of manufacturing a semiconductor device that is suitable for forming a one-step tapered groove even when a substrate material is a difficult-to-etch material. The method of manufacturing a semiconductor device includes a metal mask forming step, a dry etching step, and a metal mask removing step. The metal mask formation step forms a tapered metal mask having an opening on the back surface of the substrate. The opening exposes a part in the back surface, and an edge portion of the opening has a forward taper to the back surface. The dry etching step forms a tapered groove on the substrate by performing, from an upper side of the tapered metal mask, dry etching on the edge portion of the opening and the substrate exposed from the opening. The metal mask removing step removes the tapered metal mask.

10 Claims, 26 Drawing Sheets

(51) Int. Cl.
  *H01L 21/311* (2006.01)
  *H01L 21/32* (2006.01)
  *H01L 21/033* (2006.01)
  *H01L 21/306* (2006.01)
  *H01L 23/48* (2006.01)
  *H01L 21/441* (2006.01)

(56) References Cited

U.S. PATENT DOCUMENTS

| | | | |
|---|---|---|---|
| 2009/0146261 A1* | 6/2009 | Onodera | H01L 21/76898 257/621 |
| 2012/0115327 A1 | 5/2012 | Miki | |
| 2012/0175781 A1* | 7/2012 | Suto | H01L 21/76898 257/774 |
| 2014/0117549 A1* | 5/2014 | Tsunami | H01L 21/76898 257/751 |

FOREIGN PATENT DOCUMENTS

| | | |
|---|---|---|
| JP | 2007-311385 A | 11/2007 |
| JP | 2008-140861 A | 6/2008 |
| JP | 2010-141178 A | 6/2010 |
| JP | 2012-099761 A | 5/2012 |
| JP | 2012-146800 A | 8/2012 |
| JP | 2013-191763 A | 9/2013 |
| JP | 2015-204409 A | 11/2015 |

OTHER PUBLICATIONS

Google Patent Translation of JP 2013191763 A (Year: 2013).*
International Search Report issued in PCT/JP2017/012100; dated May 16, 2017.
An Office Action; "Notification of Reasons for Refusal," mailed by the Japanese Patent Office dated Aug. 29, 2017, which corresponds to Japanese Patent Application No. 2017-531924; with English language translation.

* cited by examiner

SEMICONDUCTOR DEVICE MANUFACTURING METHOD AND SEMICONDUCTOR DEVICE

FIELD

The present invention relates to a semiconductor device manufacturing method and a semiconductor device.

BACKGROUND

The following PTL 1 describes a dry etching method for enabling formation of an etching article having a smooth and continuous taper etching profile. As described in paragraph 0028 of PTL 1, an aluminum film and an amorphous silicon film are described as etching target films.

CITATION LIST

Patent Literature

[PTL 1] JP H10-214826 A

SUMMARY

Technical Problem

As described in PTL 1, a technique for forming a forward tapered groove in a substrate is known, A forward tapered shape in which the width at a position of the groove is smaller as the position of the groove is deeper is also referred to "tapered". Grooves formed in substrates are roughly classified into via holes, trenches, and mesas. Hereinafter, a tapered via hole, a tapered trench, and a tapered mesa are collectively referred to as a "tapered groove" for the sake of convenience. The tapered groove is advantageous in that exfoliation of a film provided on the inner wall surface of the tapered groove is suppressed as compared with a groove having a step. However, a technique for forming a tapered groove in an excellent shape greatly depends on the material of a substrate. Actually, the aforementioned PTL 1 gives only description on an aluminum film and an amorphous silicon film.

The inventor of the present application has also made an earnest study of formation of tapered grooves for compound semiconductors such as SiC and GaN and insulators such as $Al_2O_3$. The compound semiconductors such as SiC and GaN and the insulators such as $Al_2O_3$ are difficult-to-etch materials that are more difficult to be etched than silicon and the like. When the difficult-to-etch materials are subjected to dry etching, it is impossible to use a resist as an etching mask for performing dry etching on the difficult-to-etch materials. Accordingly, it is impossible to form a tapered groove by using a tapered resist mask. This is because the etching rate of the resist is generally higher than that of the difficult-to-etch materials. There has been a problem that there has not existed any manufacturing method capable of excellently forming tapered grooves in difficult-to-etch materials in the past.

An object of the present invention is to provide a method of manufacturing a semiconductor device suitable for forming a one-step tapered groove even when a substrate material is a difficult-to-etch material.

Another object of the present invention is to provide a semiconductor device which is improved so that exfoliation of backside metal or a film provided in a tapered groove of a compound substrate can be suppressed.

Solution to Problem

A method of manufacturing a semiconductor device according to a first aspect of the present invention includes:
a metal mask forming step of forming a tapered metal mask having an opening on a back surface of a substrate, wherein the opening exposes a part in the back surface, and an edge portion of the opening has a forward taper to the back surface;
a dry etching step of performing, from an upper side of the tapered metal mask, dry etching on the edge portion of the opening and the substrate exposed from the opening, thereby forming a tapered groove on the substrate; and
a metal mask removing step of removing the tapered metal mask.

A semiconductor device according to a second aspect of the present invention includes:
a compound substrate having a front surface and a back surface;
a semiconductor device provided on a side of the front surface;
a tapered via hole provided on the back surface; and
a backside metal provided on a side of the back surface so as to cover an inner wall surface of the tapered via hole, wherein the tapered via hole is narrower as a position thereof is deeper from the back surface and has no step in an area extending from the back surface to the front surface.

A semiconductor device according to a third aspect of the present invention includes:
a compound substrate having a first surface and a second surface on an opposite side to the first surface:
a tapered trench or tapered mesa provided on the first surface of the compound substrate; and a film covering an inner wall surface of the tapered trench or an inner wall surface of the tapered mesa, wherein the tapered trench or the tapered mesa has a taper whose width is smaller as a position of the taper is deeper from the first surface of the compound substrate, and the inner wall surface has needle-like irregularities.

Advantageous Effects of Invention

According to the first invention, since the tapered metal mask is used, a one-step tapered groove can be formed in a substrate in the case of not only an easy-to-etch material, but also a difficult-to-etch material.

According to the second invention, a tapered via hole whose inner wall surface has no step and is made flat is formed in a compound substrate, which makes it possible to suppress exfoliation of a backside metal film.

According to the third invention, since needle-like irregularities are provided on the inner wall surface of a tapered trench or the inner wall surface of a tapered mesa, the adhesion between the film covering the inner wall surface and the compound substrate can be enhanced. The film covering the inner wall surface is, for example, an insulating film, a protective film, a metal film, and a semiconductor film.

DESCRIPTION OF EMBODIMENTS

First Embodiment

Device According to First Embodiment

Figure 1:
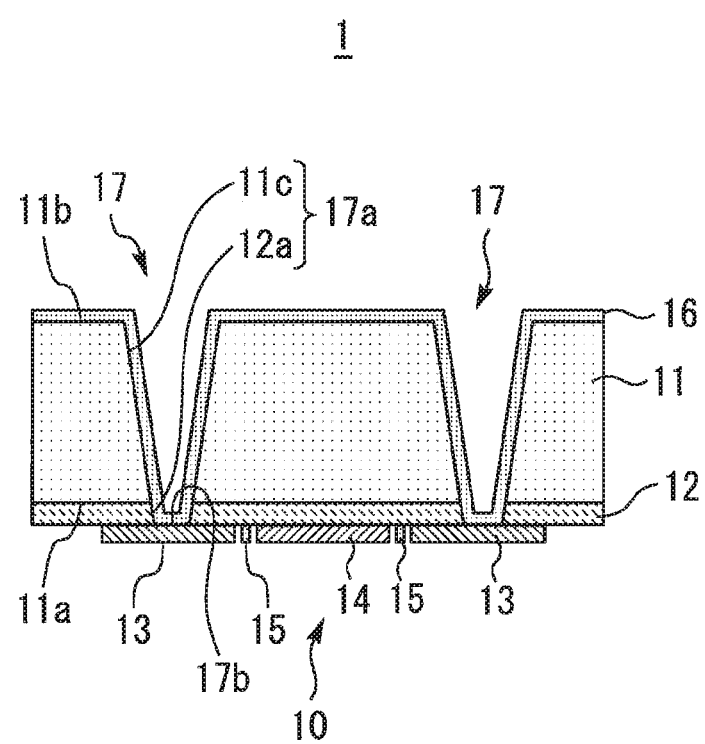
FIG. 1 is a cross-sectional view showing a semiconductor device according to a first embodiment of the present invention.

FIG. 1 is a cross-sectional view showing a semiconductor device 1 according to a first embodiment of the present invention. The semiconductor device 1 includes a compound substrate 11, a semiconductor layer 12, a transistor 10, a tapered via hole (Tapered Via Hole) 17, and backside metal 16. The compound substrate 11 has a front surface 11a and a back surface 11b. The semiconductor layer 12 and the transistor 10 are provided on the front surface 11a side of the compound substrate 11. The transistor 10 includes a source electrode 13, a drain electrode 14, and a gate electrode 15. The backside metal 16 is provided on the back surface 11b side of the compound substrate 11. The tapered via hole 17 penetrates the front surface 11a and the back surface 11b of the compound substrate 11. The source electrode 13 and the backside metal 16 are electrically connected to each other via the tapered via hole 17. The term "tapered" as used herein means a forward tapered shape in which the width at a position of the tapered via hole 17 is smaller as the position is deeper from the back surface 11b of the tapered via hole 17. The tapered via hole 17 is a one-step via hole having no step in an area extending from the back surface 11b to the front surface 11a of the compound substrate 11. The backside metal 16 is provided on the back surface 11b side so as to cover the inner wall surface 17a of the tapered via hole 17. Since the inner wall surface 17a of the tapered via hole 17 has no step and is made flat, exfoliation of the film of the backside metal 16 can be suppressed.

"Difficult-to-etch material" is used as the material of the compound substrate 11 in the first embodiment. The difficult-to-etch material is a material which is not easier to etch than Si and the like, and specific examples of the difficult-to-etch material are SiC, GaN and $Al_2O_3$. Other specific examples of the difficult-to-etch material are AlGaN and aluminum nitride (AlN). Still other specific examples of the difficult-to-etch material are any one kind of oxide ferroelectric substance selected from the group consisting of barium titanate ($BaTiO_3$), lead titanate ($PbTiO_3$), bismuth lanthanum titanate ($(Bi, La)_4Ti_3O_{12}$: BLT), lead zirconate titanate ($Pb(Zr, Ti)O_3$: PLT), lead lanthanum zirconate titanate ($(PbLa)(ZrTi)O_3$: PLZT), bismuth strontium tantalate ($SrBi_2Ta_2O_3$: SBT), bismuth titanate ($Bi_4Ti_3O_{12}$) and lithium niobate ($LiNbO_3$). The difficult-to-etch material has a characteristic that a physical reaction plays a main role in dry etching. The difficult-to-etch material also has a characteristic that an etching rate is equal to 0.1 to 1 μm/min in ordinary dry etching processing using a resist. The difficult-to-etch material also has a characteristic that the etching rate extremely decreases when the difficult-to-etch material is subjected to dry etching with Cl-based or F-based gas. In general, high-temperature melting point materials having melting points of not less than 1000° C. are easier to serve as difficult-to-etch materials. Note that a material that is easier to etch than the difficult-to-etch material is also referred to as "easy-to-etch material" for the sake of convenience. For example, Si is an easy-to-etch material.

Considering that a high-frequency operation is performed, it is desirable that the thickness of the compound substrate 11 is in the range from 10 μm to 200 μm. When the thickness of the compound substrate 11 is less than 10 μm, there is a risk that cracks occur in the compound substrate 11, and the insulating property of the compound substrate 11 also degrades. In order to ensure the insulating property, it is desirable that the resistivity of the compound substrate 11 is equal to $1 \times 10^5$ Ωm or more. However, the thickness of the compound substrate 11 may be determined without being limited to the aforementioned desirable range, and the thickness of the compound substrate 11 may be less than 10 μm or may exceed 200 μm.

The material of the semiconductor layer 12 is GaN, AlGaN, InAlN, AlN, diamond, or the like. The semiconductor layer 12 may be a single semiconductor layer made of any one of these materials such as GaN. Alternatively, the semiconductor layer 12 may be a laminate of plural semiconductor layers made of two or more different materials selected from these materials such as GaN. It is general that the thickness of the semiconductor layer 12 is equal to 10 μm or less, but it may exceed 10 μm.

The materials of the source electrode 13, the drain electrode 14, the gate electrode 15, and the backside metal 16 may be a single metal element or an alloy. One element selected from the group consisting of Cu, Ti, Al, Au, Ni, Nb, Pd, Pt, Cr, W, Ta, and Mo may be used as the single metal element. As the alloy may be used AuGe, AuGa, AuSn, or the like. Furthermore, ohmic properties may be imparted to the source electrode 13 and the like by performing a heat treatment, ion implantation or the like.

Figure 2:
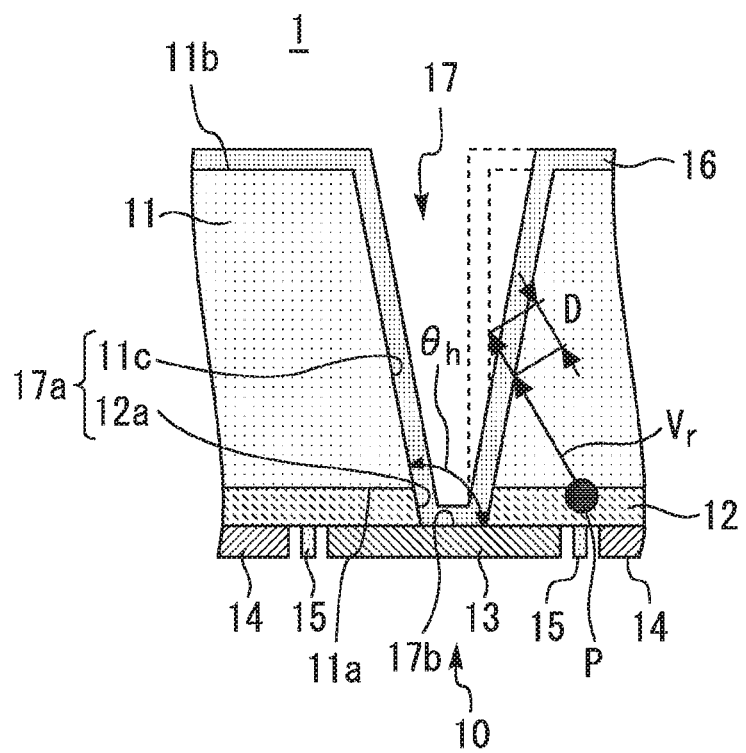
FIG. 2 is a diagram showing a structure near the via hole and a heat dissipation effect of the semiconductor device according to the first embodiment of the present invention.

FIG. 2 is a diagram showing a structure near the via hole and a heat dissipation effect of the semiconductor device 1 according to the first embodiment of the present invention. The tapered via hole 17 has an inner wall surface 17a and a bottom surface 17b. The bottom surface 17b is the same as the back surface of the source electrode 13. The inner wall surface 17a is configured by a wall surface 11c of the compound substrate 11 and a wall surface 12a of the semiconductor layer 12.

The tapered via hole 17 has a taper angle $\theta_h$. The taper angle $\theta_h$ is an intersection angle between the inner wall surface 17a and the bottom surface 17b. It is desirable that the taper angle $\theta_h$ is equal to 92 to 160 degrees. The reason is as follows. The backside metal 16 plays a role of dissipating heat generated from the transistor to the outside. When the taper angle $\theta_h$ decreases to less than 92 degrees, heat generated from the semiconductor layer 12 just under the gate electrode 15 is hard to be conducted to the backside metal 16, so that the heat dissipation effect degrades. Particularly, when a material whose thermal conductivity lower at high temperature than that at a room temperature like a SiC substrate is used for the compound substrate 11, thermal runaway at high temperature may cause a trouble. On the other hand, when the taper angle $\theta_h$ exceeds 160 degrees, cracks may occur in the compound substrate 11 due to strength degradation of the compound substrate 11 around the via. Furthermore, leak current between the backside metal and the drain electrode or the gate electrode is likely to occur due to degradation of the insulating property of the compound substrate 11 around the via hole. For such a reason, it is desirable that the taper angle $\theta_h$ is equal to 92 to 160 degrees.

It is desirable that the tapered via hole 17 is formed just under the source electrode 13. Particularly, in the case of a multi-finger gate, it is preferable that the tapered via hole 17 is formed just under the source electrode 13 corresponding to each gate electrode 15. This makes it possible to improve high frequency characteristics and also to improve the heat dissipation of the transistor.

Operations and effects of the device according to the first embodiment will be described. First, an effect of suppressing exfoliation of the backside metal will be described. For comparison, the description will be made while comparing the tapered via hole 17 and a "two-step via hole". The "two-step via hole" is a via hole having a stair-like groove structure having two-stage sizes (diameters). Stress concentrates on a stepped portion of the two-step via hole when internal stress caused by formation of the backside metal film, film stress caused by the difference in thermal expansion coefficient under a high temperature operation of the semiconductor device 1, mechanical external force and the like occur. Stress concentration on the stepped portion tends to cause exfoliation of the film of the backside metal 16. On the other hand, the tapered via hole 17 can suppress exfoliation of the film of the backside metal 16 caused by the stress concentration because the tapered via hole 17 has no step portion. Next, a heat dissipation enhancing effect will be described. As indicated by an arrow Vr in FIG. 2, the heat dissipation distance from a heat generating site P in the semiconductor layer 12 just under the gate electrode 15 during an operation of the transistor to the backside metal 16 can be shortened by only a distance D as compared with a case of a vertical via hole (broken line in FIG. 2). Therefore, the tapered via hole 17 has higher heat dissipation performance than the vertical via hole (broken line in FIG. 2).

The following various modifications can be applied to the semiconductor device 1 according to the first embodiment. For example, the material of the compound substrate 11 may be other compound semiconductors such as GaAs and InP.

The transistor may be configured by only the compound substrate 11 without forming the semiconductor layer 12. That is, it is assumed that the transistor 10 provided on the "front surface 11a side" of the compound substrate 11 includes not only the transistor 10 provided on the semiconductor layer formed on the front surface 11a of the compound substrate 11, but also a transistor which is directly provided on the surface 11a of the compound substrate 11.

In FIG. 2, the wall surface 11c of the compound substrate 11 and the wall surface 12a of the semiconductor layer 12 have the same taper angle $\theta_h$ with respect to the bottom surface 17b. However, the wall surface 11c of the compound substrate 11 and the wall surface 12a of the semiconductor layer 12 may have different taper angles $\theta_h$. For example, an angle at which the wall surface 12a of the semiconductor layer 12 intersects to the bottom surface 17b may be smaller than an angle at which the wall surface 11c of the compound substrate 11 intersects to the bottom surface 17b. As a specific example, the wall surface 12a of the semiconductor layer 12 may intersect vertically to the bottom surface 17b whereas the wall surface 11c of the compound substrate 11 intersects to the bottom surface 17b at an angle of 92 degrees or more.

In FIG. 2, the wall surface 11c of the compound substrate 11 and the wall surface 12a of the semiconductor layer 12 are connected to each other without any step. However, a step may be formed between the wall surface 11c of the compound substrate 11 and the wall surface 12a of the semiconductor layer 12 when the thickness of the semiconductor layer 12 is within 10 μm.

The tapered via hole 17 may not be formed just under the source electrode 13. Instead of the source electrode 13, via receiving metal may be provided to the compound substrate 11. As a result, the source electrode 13 and the tapered via hole 17 may be arranged to be displaced from each other. In the first embodiment, the semiconductor device 1 of such a type that the source electrode 13 is grounded is described. On the other hand, when the drain electrode 14 or the gate electrode 15 is grounded, the tapered via hole 17 may be provided just above the drain electrode 14 or the gate electrode 15.

Note that the number of the tapered via holes 17 included in the semiconductor device 1 may be one. In the semiconductor device 1, the tapered via hole 17 and a vertical via hole having no taper may be mixed.

The inner wall surface 17a of the tapered via hole 17 is formed to have a linearly sloped taper in cross-sectional view shown in FIG. 1, etc. On the other hand, as a modification, the inner wall surface 17a may be sloped in a curved-line style in cross-sectional view shown in FIG. 1, etc. When the inner wall surface 17a has a curved sloped taper, the inner wall surface 17a may be formed to have a convex curved surface which protrudes outwards in cross-sectional view shown in FIG. 1, etc., or may be formed to have a concave curved surface which is recessed inwards in cross-sectional view shown in FIG. 1, etc. For example, by causing the inner wall surface 17a to have such a curved slope taper that the inner wall surface 17a has a convex curved surface in cross-section, the entrance diameter of the tapered via hole 17 may be widened at a larger rate of change than that of the linearly sloped taper shown in FIG. 2, which further enhances the heat dissipation property.

Figure 3:
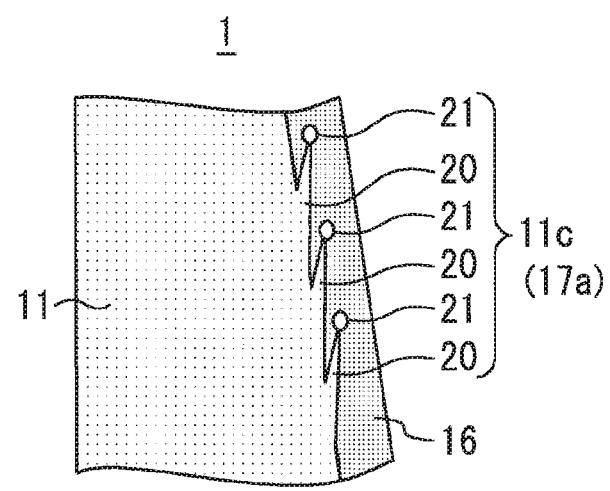
FIG. 3 is a diagram showing a semiconductor device according to a modification of the first embodiment of the present invention.

FIG. 3 is a diagram showing a semiconductor device 1 according to a modification of the first embodiment of the present invention. As shown in FIG. 3, needle-like irregularities 20 and terminals of minute metal bodies 21 may be applied to the semiconductor device 1. The inner wall surface 17a has the needle-like irregularities 20. The tips of the needle-like irregularities 20 are covered with the minute metal bodies 21. The backside metal 16 covers the minute metal bodies 21 and the needle-like irregularities 20. The minute metal bodies 21 may be formed of the same material as or a different material from the backside metal 16. An anchor effect is generated by adding the needle-like irregularities 20 to the inner wall surface 17a of the tapered via hole 17, whereby the adhesion between the backside metal 16 and the inner wall surface 17a can be enhanced. The tips of the needle-like irregularities 20 may be terminated, that is, covered with the minute metal bodies 21 different from the backside metal 16. As a result, the adhesion of the backside metal 16 can be further enhanced. In the difficult-to-etch materials and the high melting point materials, diffusion of atoms hardly occurs among the materials, and chemical reactivity is poor. Therefore, when these materials are used for the compound substrate 11, film exfoliation of the backside metal 16 may occur. In this respect, in the modification according to FIG. 3, the adhesion between the backside metal 16 and the inner wall surface 17a can be enhanced. Note that whether the end portions of the needle-like irregularities 20 are covered with metal atoms is checked by using a general elemental analysis method (photoelectron spectroscopy, energy dispersion type X-ray analysis, secondary ion mass spectrometry, etc.).

Figure 4:
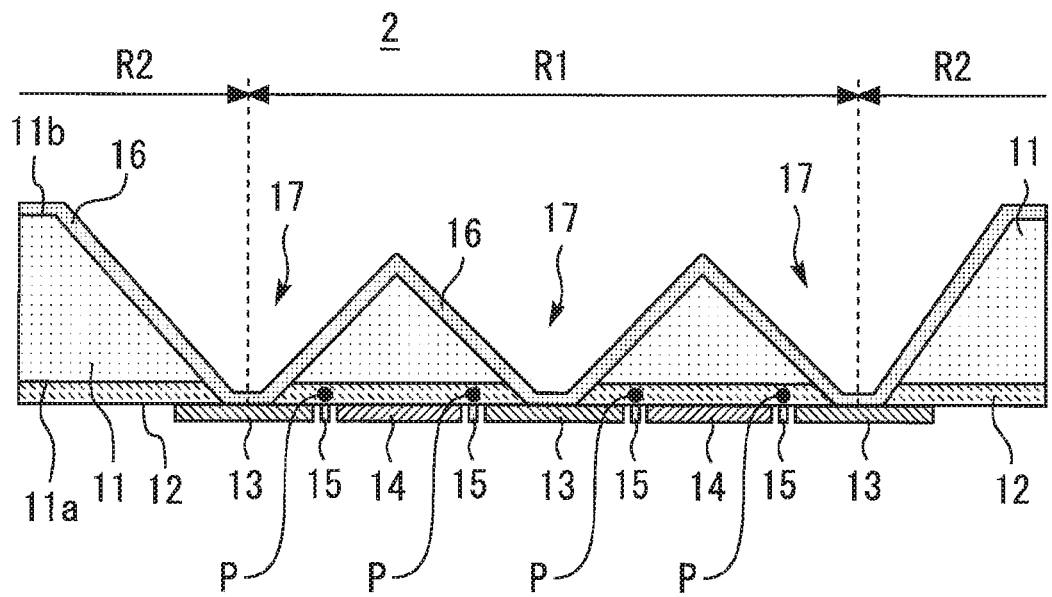
FIG. 4 is a diagram showing a semiconductor device according to a modification of the first embodiment of the present invention.
Figure 5:
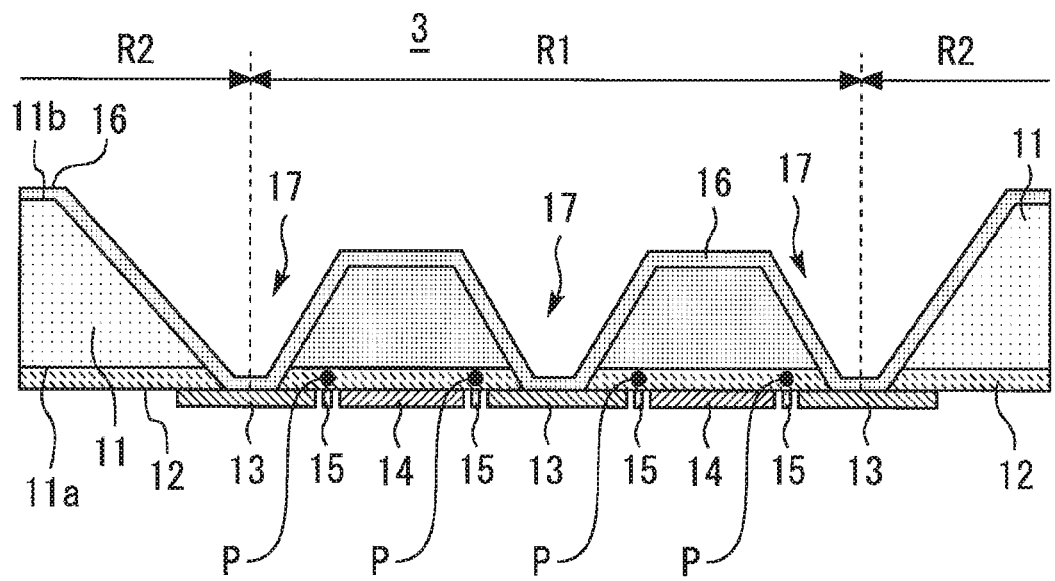
FIG. 5 is a diagram showing a semiconductor device according to a modification of the first embodiment of the present invention.

FIGS. 4 and 5 are diagrams showing semiconductor devices 2 and 3 according to modifications of the first embodiment of the present invention. The compound substrate 11 is provided with plural tapered via holes 17 which are adjacent to each other. A first region R1 sandwiched between the plural tapered via holes 17 on the back surface 11b is thinner than second regions R2 other than the first region R1 on the rear surface 11b. Particularly, in a multi-finger type transistor structure, the compound substrate 11 can be thinned in the first region R1 sandwiched between the plural tapered via holes 17. As a result, the distance from heat generating sites P to the backside metal 16 can be reduced, so that the heat dissipation of the transistor can be enhanced. When the thickness of the entire compound substrate 11 is small, the mechanical strength of the semiconductor device 1 is lost, which causes a problem such as breakage caused by cracking. In this respect, in the first embodiment, the thickness of the compound substrate 11 can be made sufficiently thick in the second regions R2, so that the heat dissipation property can be enhanced while keeping the mechanical strength high. Particularly, when a SiC substrate is used for the compound substrate 11, the thermal conductivity of the SiC substrate decreases at high temperature. In this respect, according to the first embodiment, heat is easily transferred to the backside metal film by reducing the thickness of the substrate just under the gate electrode 15, so that an effect of stabilizing the heat dissipation property against temperature change can be obtained. Note that the shape of the first region R1 of the compound substrate 11 may be a protruding shape which is pointed to the back surface side in cross-sectional view like the semiconductor device 2 of FIG. 4, or may be a trapezoidal shape in cross-sectional view so as to have a flat portion facing the back surface side like the semiconductor device 3 of FIG. 5. In the compound substrate 11, it is required only that the first region R1 is thinner than the second regions R2

Manufacturing Method According to First Embodiment

Figure 6:
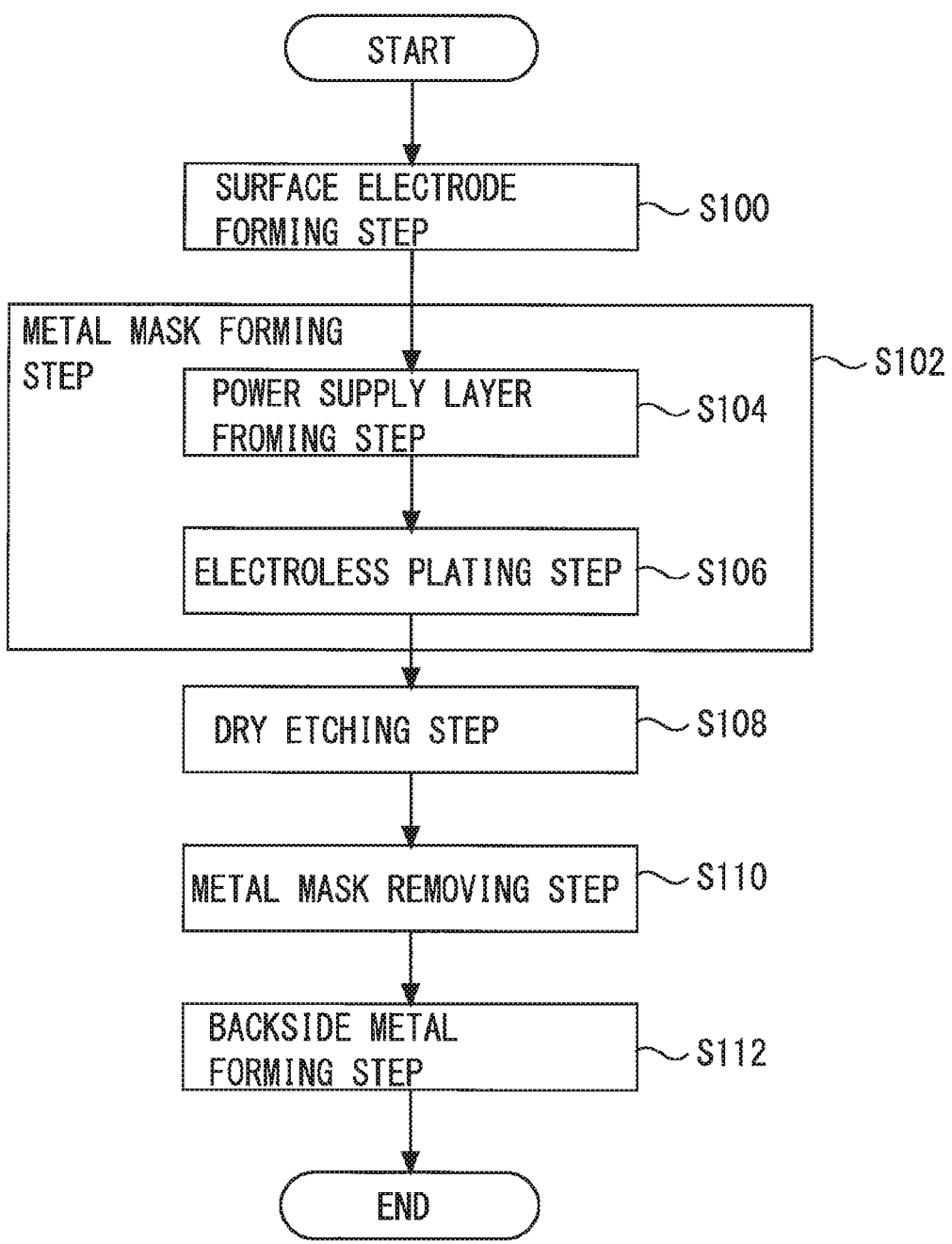
FIG. 6 is a flowchart showing the method of manufacturing the semiconductor device according to the first embodiment of the present invention.
Figure 9:
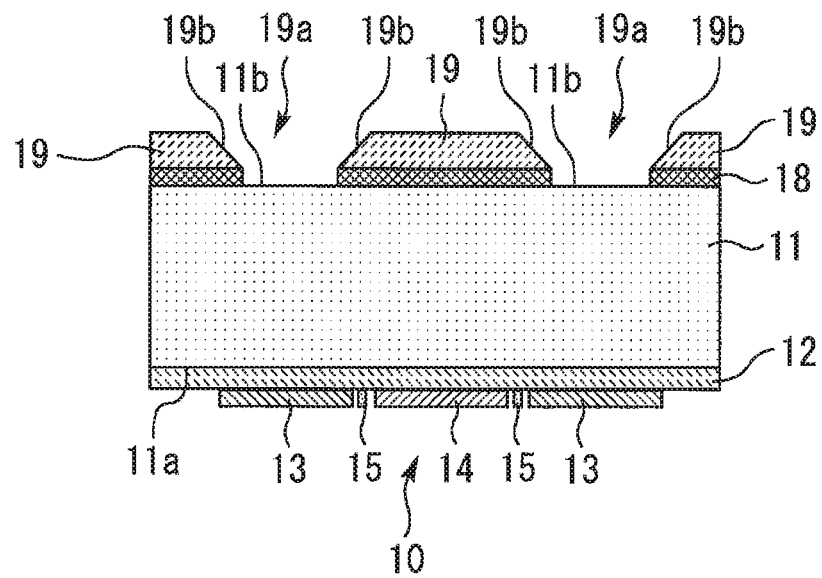
FIG. 9 is a view showing the method of manufacturing the semiconductor device according to the first embodiment of the present invention.
Figure 10:
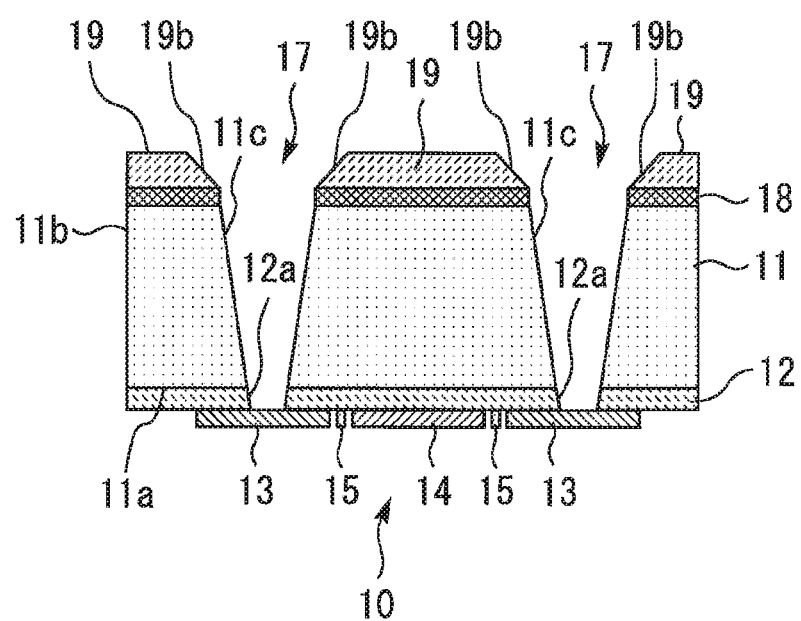
FIG. 10 is a view showing the method of manufacturing the semiconductor device according to the first embodiment of the present invention.
Figure 11:
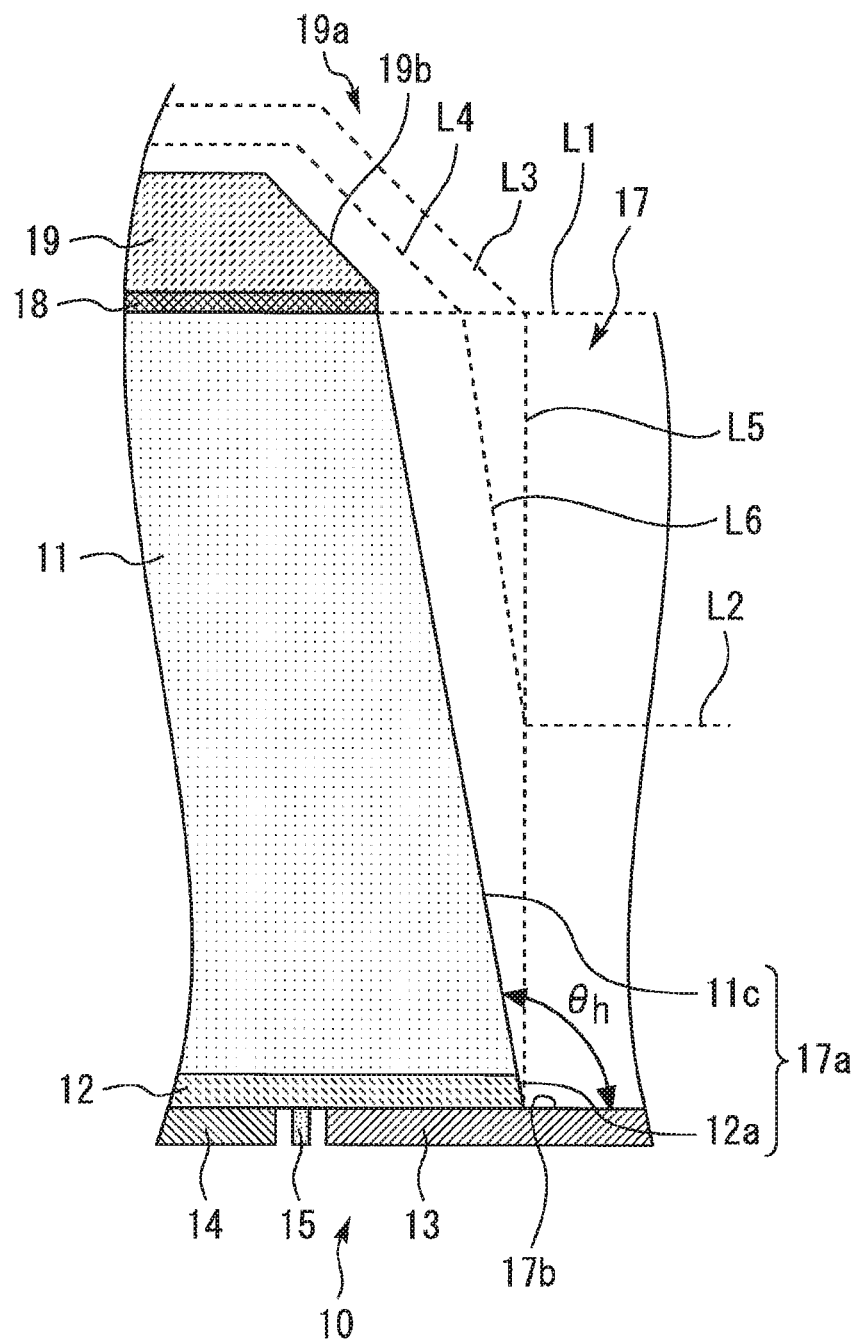
FIG. 11 is a view showing a dry etching in the method of manufacturing the semiconductor device according to the first embodiment of the present invention.
Figure 12:
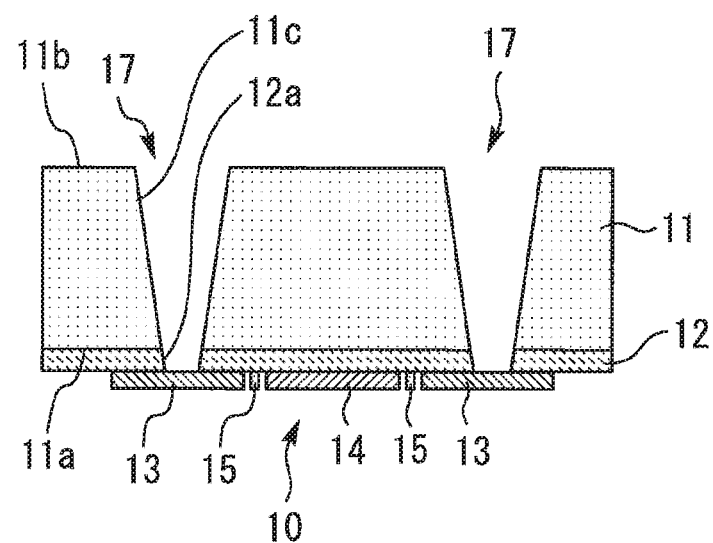
FIG. 12 is a view showing the method of manufacturing the semiconductor device according to the first embodiment of the present invention.
Figure 13:
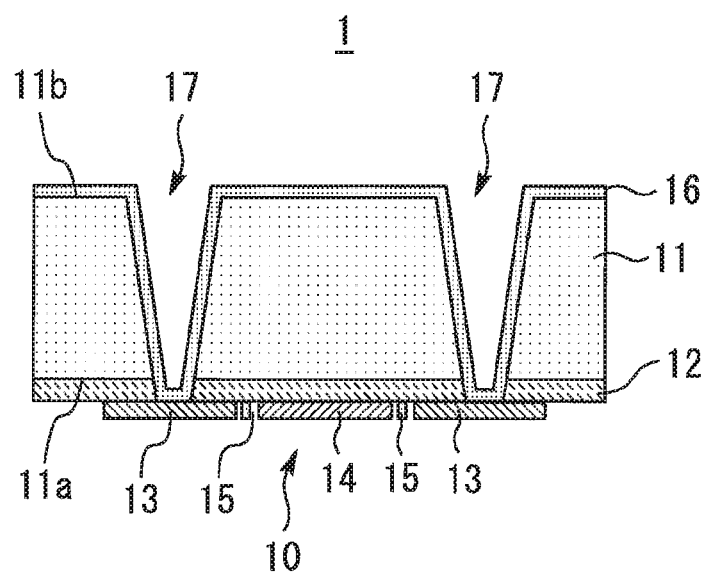
FIG. 13 is a view showing the method of manufacturing the semiconductor device according to the first embodiment of the present invention.

A manufacturing method according to the first embodiment is suitable for manufacturing the semiconductor device 1 according to the first embodiment. FIG. 6 is a flowchart showing the method of manufacturing the semiconductor device according to the first embodiment of the present invention. FIGS. 7 to 13 are views showing the method of manufacturing the semiconductor device according to the first embodiment of the present invention. Particularly, FIG. 11 is a diagram showing dry etching in the method of manufacturing the semiconductor device according to the first embodiment of the present invention.

Figure 7:
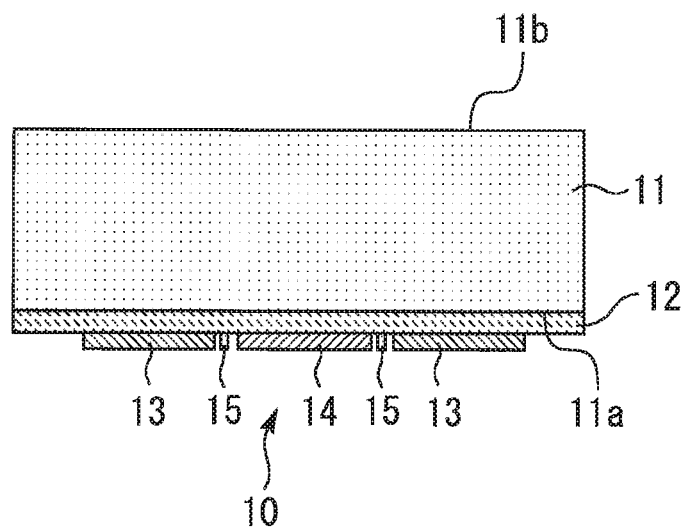
FIG. 7 is a view showing the method of manufacturing the semiconductor device according to the first embodiment of the present invention.

In the flowchart shown in FIG. 6, a surface electrode forming step (step S100) is first performed. As shown in FIG. 7, a semiconductor layer 12 is formed on a compound substrate 11 by a metal organic vapor growth method, a molecular beam epitaxy method, or the like. Furthermore, a source electrode 13, a drain electrode 14, and a gate electrode 15 are formed on the front surface side of the compound substrate 11. A protective film such as an insulating film and a resistive film may be stacked on the source electrode 13 or the like as required.

The material of the compound substrate 11 is a compound semiconductor or $Al_2O_3$. The material of the compound substrate 11 is a difficult-to-etch material for which the etching rate in dry etching using a resist is equal to 0.1 to 1 μm/min.

Next, a metal mask forming step (step S102) is performed. The metal mask forming step includes a power supply layer forming step (step S104) shown in FIG. 8 and an electroless plating step (step S106) shown in FIG. 9.

Figure 8:
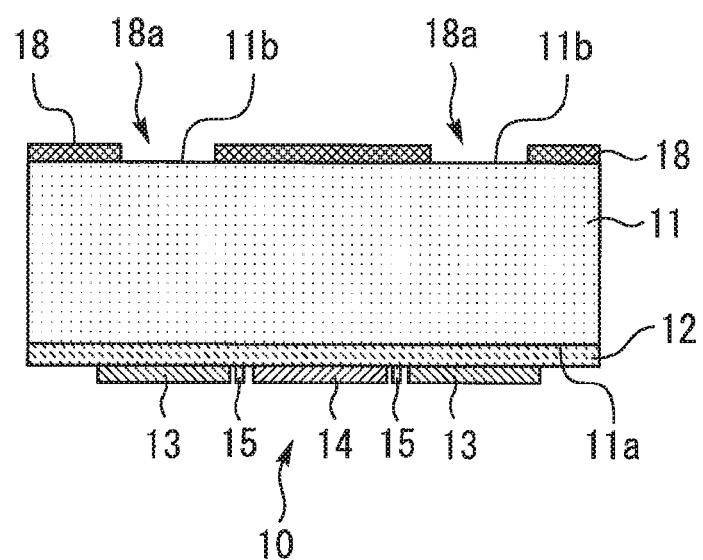
FIG. 8 is a view showing the method of manufacturing the semiconductor device according to the first embodiment of the present invention.

As shown in FIG. 8, in the power supply layer forming step (step S104), a power supply layer 18 is provided on the back surface 11b of the compound substrate 11. A part of the back surface 11b is not covered with the power supply layer 18, whereby metal mask openings 19a described later with respect to FIG. 9 are provided to the tapered metal mask 19. The power supply layer 18 is formed by using a resist according to a lift-off process or an etching process. In order to prevent oxidation, noble-metal based metal such as Au, Pt, or Pd may be used for the power supply layer 18. A main component of the power supply layer 18 may be the same as the main component of the tapered metal mask 19, whereby stability in the processing rate during dry etching processing can be enhanced. Furthermore, an adhesion layer may be provided between the power supply layer 18 and the compound substrate 11. The power supply layer 18 may have a multilayer structure.

In the electroless plating step (step S106), a tapered metal mask 19 is formed by performing electroless plating on the power supply layer 18 with electroless plating solution containing catalyst poison. As shown in FIG. 9, the tapered metal mask 19 having metal mask openings 19a is formed on the back surface 11b of the compound substrate 11. The metal mask openings 19a expose a part of the back surface 11b, and edge portions 19b of the metal mask openings 19a have forward tapers toward the back surface 11b.

The catalyst poison has a function of suppressing plating growth by adsorbing on a plating film. Since the concentration of the catalyst poison increases at an end portion of the power supply layer 18, plating growth is hindered. On the other hand, since the concentration of the catalyst poison decreases at a central portion of the power supply layer 18, plating growth proceeds. As a result, an electroless plating film having a tapered end portion can be formed as the tapered metal mask 19. In order to secure resistance to dry etching processing, it is preferable that the main component of the tapered metal mask 19 is one metal element selected from the group consisting of Cr, Cu, Ni, and Al. The main component of the tapered metal mask 19 may be an alloy of these metal elements.

It is preferable that the catalyst poison contained in the electroless plating solution is one of the following first to fifth substances. The first substance is at least one kind of metal ion selected from the group consisting of lead, bismuth, antimony, tellurium and copper ions. The second substance is a sulfur compound. The third substance is a nitrogen compound. The fourth substance is polyethylene glycol. The fifth substance is acetylene-based alcohol. Preferably, it is preferable that the first to fifth substances are contained as the catalyst poison by 0.1 to 40 mg/L in the electroless plating solution.

The taper angle $\theta_h$ can be adjusted by the concentration of the catalyst poison in the electroless plating solution. For example, when lead is put in general electroless nickel plating solution composed of nickel sulfate and sodium hypophosphite, the taper angle $\theta_h$ is as follows. The taper angle $\theta_h$ in the case where 0.5 mg/L of lead is put in the electroless nickel plating solution is equal to 35°, the taper angle $\theta_h$ in the case where 1.0 mg/L of lead is put is equal to 12°, and the taper angle $\theta_h$ in the case where 1.5 mg/L of lead is put is equal to 6°. The taper angle $\theta_h$ may be changed to a different taper angle from the above values by changing the configuration and the condition for use of the electroless plating solution.

In addition to the catalyst poison, when a reaction accelerator for promoting the plating reaction is contained, the taper shape may be lost in some cases. In this case, it is necessary to adjust the concentration of the catalyst poison and the reaction accelerator so that the taper shape is maintained. Specifically, it is preferable that the concentration of the catalyst poison is higher than the concentration of the reaction accelerator.

Next, a dry etching step (step S108) is performed. In the dry etching step, dry etching is performed from an upper side of the tapered metal mask 19. By this dry etching, edge portions 19b of the metal mask openings 19a and the compound substrate 11 exposed from the metal mask openings 19a are etched. As a result, as shown in FIG. 10, the tapered via holes 17 can be formed in the compound substrate 11. Broken lines L1 to L6 shown in FIG. 11 schematically show progress of the dry etching in the dry etching step. As indicated by the broken lines L3 and L4 in FIG. 11, the edge portion 19b of the tapered metal mask 19 retreats by the dry etching, so that the opening diameter of the metal mask opening 19a continuously increases as the dry etching progresses. A groove is dug from the broken line L1 to the broken L2 in the compound substrate 11 by the dry etching, and further the side wall of the groove is tapered from the broken line L5 to the broken line L6 by the dry etching. By performing the dry etching until the compound substrate 11 has been penetrated, a one-step tapered via hole 17 which is narrower as the position thereof is deeper from the back surface 11b of the compound substrate 11 can be formed in the compound substrate 11.

In the first embodiment, the tapered via holes 17 are formed by dry etching using etching gas containing F and Cl. The reason for selecting "etching gas containing F and Cl" is as follows. First, in the dry etching, there is a reaction in which a substance volatilizing at room temperature or less is generated by a chemical reaction and the substance desorbs. $AsF_3$ volatilizing at −50° C. or the like is known as one example. In order to achieve a high selection ratio, it is preferable to use a mask material with which products do not desorb at room temperature. With respect to this point, use of gas containing Cl and F generally makes it possible to generate a nonvolatile substance for realizing high selectivity with the tapered metal mask 19. For the tapered metal mask 19 is used a material which generates a nonvolatile substance when dry etching is performed by using F-based and Cl-based gas, and has a high selection ratio to the material of the compound substrate 11 even under high-power plasma. Specifically, it is preferable to use Ni, Cr, Cu, Al as the material of the tapered metal mask 19. For example, in the case of a Ni mask, a nonvolatile substance such as $NiF_2$ is generated by F-based etching gas. The volatilization point of $NiF_2$ is equal to 1760° C. $SF_6$, $CF_4$, $NF_3$, $PF_5$, $BF_3$, $CHF_3$ or the like may be used as the F-based gas. $Cl_2$, $SiCl_4$ or the like may be used as the Cl-based gas.

There are two main principles of dry etching, and the two principles are "sputtering based on ions" and "reactive etching based on a chemical reaction of etching gas", in the first embodiment, dry etching on the compound substrate 11 can be advanced mainly by only a sputtering effect based on ions. Therefore, anisotropic etching becomes remarkable, and thus it is possible to process deep holes in the compound substrate 11. Furthermore, in the first embodiment, tapered via holes can be formed by using the tapered metal mask 19 in which the edge portions 19b of the metal mask openings 19a are tapered.

However, the manufacturing method according to the first embodiment is not limited to "etching gas containing F and Cl", but as required, it may be mixed with other etching gas, or the processing may be performed by using other etching gas such as bromine-based gas.

In the first embodiment, the tapered metal mask 19 is used, and no resist mask is used. The reason is as follows. Since compound materials such as SiC are difficult-to-etch etching materials, high power based on high power plasma like an antenna 1000 W is required for thy etching. "High power plasma" means a case where antenna power of 1000 W or more is applied in an etching apparatus typified by an ICP method. There has never been any resist material that can be used at practical levels for etching compound materials under high power plasma. In the first embodiment, by using the tapered metal mask 19, even when the material of the compound substrate 11 is a difficult-to-etch material, a one-stage tapered via hole 17 can be formed in the compound substrate 11.

Next, in the metal mask removing step (step S110), the tapered metal mask 19 is removed. Wet etching using acid or alkali suitable for each metal material or dry etching processing may be used. Note that the power supply layer 18 may be removed or may be left as it is.

Next, a backside metal forming step (step S112) is performed. The backside metal 16 has a role of making the source electrodes at different positions have the same potential, and has an effect of improving high frequency characteristics.

According to the manufacturing method described above, the semiconductor device 1 having the tapered via holes 17 can be manufactured.

A metal burying step may be further performed. In the metal burying step, the inside of the tapered via hole 17 is buried with a plating film from the back surface 11b side to further improve the heat dissipation. According to the tapered via hole 17, the inside of the tapered via hole 17 can be easily buried with metal even by ordinary electroplating. Alternatively, via filling type plating solution may be used.

Advantages of the manufacturing method according to the first embodiment will be described. A technique of forming a one-step tapered via hole 17 by using as a tapered metal mask 19 for dry etching processing on a difficult-to-etch material is a novel and unique technique which has been conceived by the inventor of the present application for the first time. Hereinafter, the advantages of the first embodiment will be described while referring to the related art.

In the case of the "two-step via hole" described above, formation of plural tapered metal masks 19 causes a problem of variation in shape among via holes due to misalignment during superimposition. On the other hand, in the first embodiment, it is enough only to use one tapered metal mask 19, so that variation in via shape can be suppressed. Moreover, when a plating film is formed on the backside metal 16 by using electroplating, the film forming rate increases at a step portion (convex portion) of the two-step via hole due to concentration of electric field, whereas the film forming rate decreases at a bottom portion of the two-step via hole. As a result, a void may be formed in the vicinity of the bottom of the two-step via hole. On the other hand, in the first embodiment, the tapered via hole 17 has a one-step tapered via hole having no step portion therein, so that the opening diameter of the via hole continuously decreases in the depth direction. Such a continuous opening shape having no step makes it possible to form a plating film having no void even when the film forming rate in the vicinity of the bottom surface 17b of the tapered via hole 17 is slow. Furthermore, according to the first embodiment, the opening diameter at the bottom surface 17b of the tapered via hole 17 can be made smaller than the opening diameter at the entrance of the tapered via hole 17. Accordingly, the source electrode 13 constituting the bottom surface 17b of the tapered via hole 17 can be configured to have a small area, thereby enabling chip shrink of the semiconductor device 1.

By forming the tapered metal mask 19 in the metal mask forming step (step S102) according to the first embodiment, the tapered via hole 17 can be formed with high reproducibility without use of any special processing device and without performing processing at high temperature. When related arts are cited as comparative examples in order to describe this effect, it is first considered as a first related art to use a tapered resist. However, even if the tapered resist is wished to be used, the tapered resist has low resistance to dry etching, and thus it is difficult to use the tapered resist as a dry etching mask for difficult-to-etch materials. Furthermore, it is considered as a second related art to use a taper plating process based on a reverse tapered resist pattern. However, this second related art has a problem that the reproducibility is poor because the shape of the side surface of the resist is distorted or the like. Furthermore, since the second related art is a method of processing a metal mask into a tapered shape by performing ion sputtering (anisotropic etching) on the metal mask and then further performing reactive etching (isotropic etching) the metal mask, there is also a problem that the reproducibility of the tapered shape is low. As compared with these related arts, use of the tapered metal mask 19 brings highly practical use in manufacturing in the first embodiment.

Next, a plating base will be described. As a related art is known a technique of forming a power supply layer 18 and an insulating film on a base of a tapered electroless plating film and using this insulating film for patterning of the plating film. In a structure in which the backside metal 16 is stacked on the insulating film without removing the insulating film in this related art, the insulating film of SiN and $SiO_2$ or the like is sandwiched between the compound substrate 11 and the backside metal 16. Such a structure has a disadvantage that the insulating film deteriorates the heat dissipation of the semiconductor device. In this respect, when the first embodiment and this related art are compared with each other, there is a difference in that deterioration of the heat dissipation can be suppressed in the first embodiment because no insulating film is used.

GaAs and InP out of compound semiconductors are generally used in the fields of high frequency devices and optical devices. GaAs and InP have high plating reactivity, and thus plating thereof grows when the surface is exposed during electroless plating. Here, by using a compound substrate 11 having low plating reactivity, s possible in the first embodiment to perform patterning on a plating film without making use of the insulating film. The material of the compound substrate having low plating reactivity includes SiC, SiC, GaN, $Al_2O_3$ and the like.

The power supply layer 18 according to the first embodiment is provided with gaps 18a through which plating solution penetrates. If a thick resist exists when the plating film is patterned with a resist pattern, the tapered shape of the plating film cannot be obtained due to insufficient supply of catalyst poison to the end face of the plating film. In the first embodiment, the problem as described above is suppressed by the gaps 18a.

When the power supply layer 18 is funned of a material different from that of the tapered metal mask 19, the power supply layer 18 is exposed to a plasma environment with progress of dry etching, thereby inhibiting the dry etching, so that the processing rate of the compound substrate 11 may be destabilized. Therefore, it is preferable that the main components of the power supply layer 18 and the tapered metal mask 19 are set to the same metal.

The following various modifications can be made to the manufacturing method according to the first embodiment.

The material of the compound substrate 11 may be other compound semiconductors such as GaAs and InP. Alternatively, the tapered metal mask 19 may be stacked on another insulating film, a protective film or the like which is formed on the compound substrate 11. Dry etching may be performed from the upper side of the insulating film or the like to form the tapered via hole 17.

The needle-like irregularities 20 and the terminals of the minute metal bodies 21 can be added to the inner wall surface 17a. This is a technique for manufacturing the structure shown in FIG. 3. The dry etching step of step S108 may form the needle-like irregularities 20 on the inner wall surface 17a of the tapered via hole 17 by using a micro-mask effect. The "micro-mask effect" is an effect in which the minute metal bodies 21 occurring due to dry etching on the tapered metal mask 19 re-adhere to the compound substrate 11, whereby the minute metal bodies 21 function as minute masks which discontinuously covers the inner wall surface 17a. More specifically described, dry etching involves two physical phenomena of "sputtering based on ions" and "reactive etching based on chemical reaction of etching gas". The ion sputtering is anisotropic etching, whereas the active etching is isotropic etching. By using the difficult-to-etch material, etching processing can be performed mainly by the ion sputtering while suppressing the reactive etching. In the step of advancing dry etching in the depth direction of the via hole, the minute metal bodies 21 generated by the etching on the tapered metal mask 19 adhere to the inner wall surface 17a. The minute metal bodies 21 serves as minute masks, and also the anisotropic etching is performed while the reactive etching is suppressed, whereby the needle-like irregularities 20 are formed on the inner wall surface 17a. "Needle-like irregularities" are, in other words, needle-like roughness.

Note that in connection with the micro-mask effect, the tips of the needle-like irregularities 20 are covered with the minute metal bodies 21 (see FIG. 3). This is also called as "termination". As a result, the adhesion of the backside metal 16 can be improved.

A preferable temperature condition for obtaining the micro-mask effect excellently will be described. In order to obtain an excellent micro-mask effect, it is desirable that the stage temperature in an etching apparatus is set to −20° C. or more. This is because when the stage temperature is lower than −20° C., the micro-mask effect becomes too strong, which may cause a risk that a via opening defect occurs due to re-adhesion of the mask. Furthermore, in order to obtain an excellent micro-mask effect, it is desirable that the stage temperature in the etching apparatus is set to 200° C. or less. This is because when the temperature exceeds 200° C., the reactive etching becomes strong, which makes it difficult to obtain the micro-mask effect. Taking these matters into consideration, in order to obtain the micro-mask effect, it is more desirable that the stage temperature in the etching apparatus is set in the range from −20° C. to 200° C. Furthermore, during dry etching, the wafer temperature rises by about 100° C. as compared with the stage temperature due to an influence of heat input by plasma. Therefore, it is further desirable that the stage temperature is set to 100° C. or less. Furthermore, the degree of heat input by plasma varies depending on a process condition such as a processing time. The stage temperature may rise by 100° C. or more according to the process condition. Therefore, as a temperature condition considering practicality, it is further desirable that the stage temperature range is set from 0° C. to 50° C. Note that in order to stably perform dry etching, it is further desirable that a cooling heating mechanism is provided on the stage of the etching apparatus. Note that the dry etching step may be performed at room temperature. The "room temperature" is assumed to indicate a state where neither heating nor cooling is applied to the stage of the etching apparatus and the compound substrate 11 from an external system. A specific temperature of the room temperature may be 300 K, that is, 27° C. The thy etching step may be performed at a temperature of, for example, 23° C. or less. The dry etching step may be performed in a negative temperature range, but in this case, it is desirable that the stage temperature is set in the range from −20° C. to 0° C. for the foregoing reason.

Figure 14:
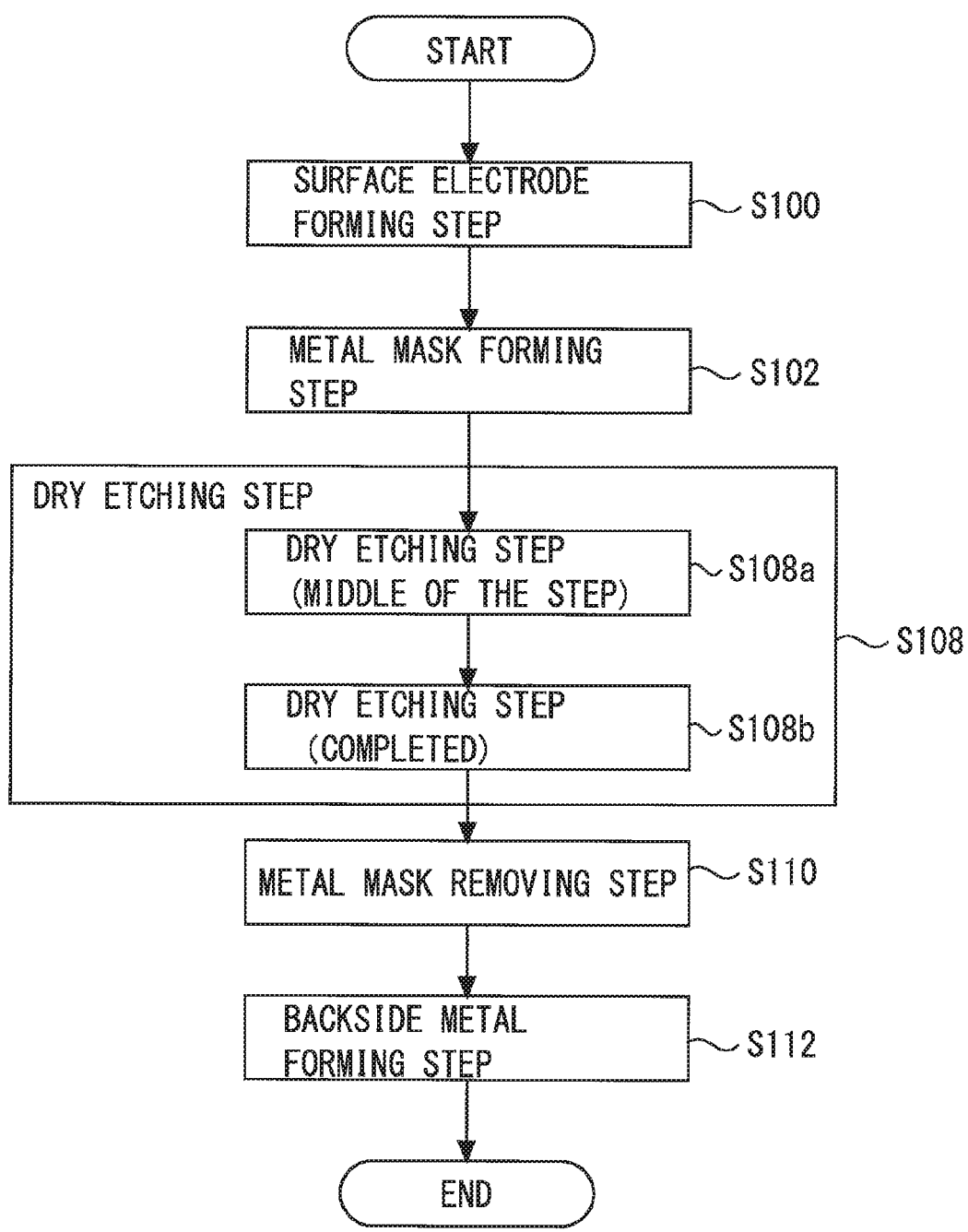
FIG. 14 is a flowchart showing a method of manufacturing a semiconductor device according to a modification of the first embodiment of the present invention.

FIG. 14 is a flowchart showing a method of manufacturing a semiconductor device according to a modification of the first embodiment of the present invention. FIGS. 15 to 19 are diagrams showing the method of manufacturing the semiconductor device according to the modification of the first embodiment of the present invention. In this modification, the metal mask forming step of step S102 and the dry etching step of step S108 are modified. Steps S100, S110, and S112 are the same as the contents described above with reference to FIG. 6.

Figure 15:
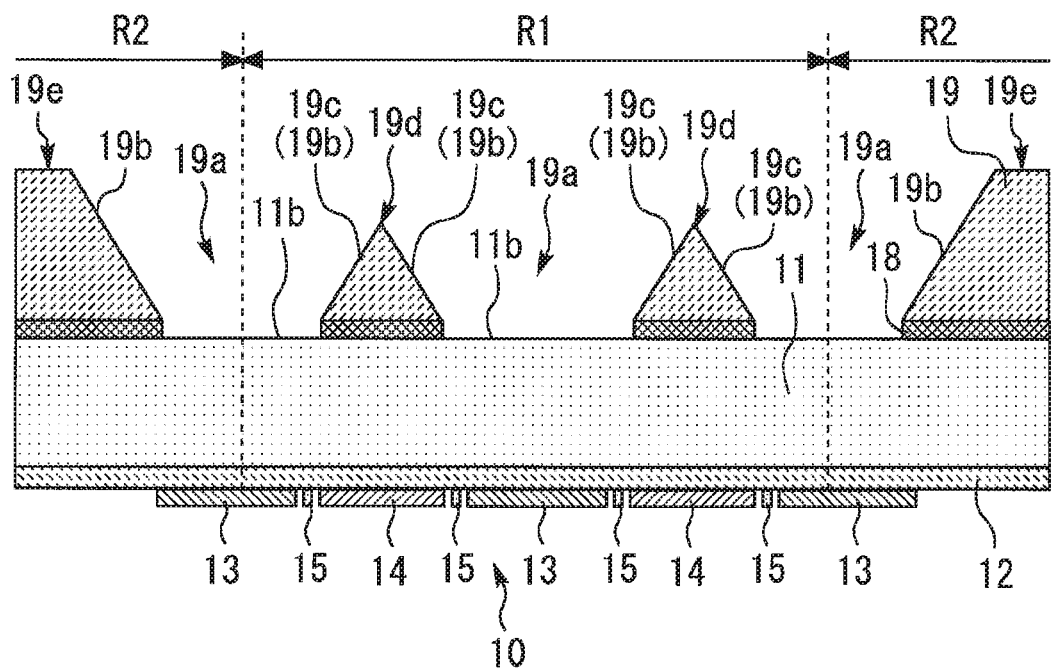
FIG. 15 is a diagram showing the method of manufacturing the semiconductor device according to the modification of the first embodiment of the present invention.

In the metal mask forming step of step S102, the following modification is performed. Two adjacent metal mask openings 19a are formed in the tapered metal mask 19. A first portion 19d sandwiched between the two metal mask openings 19a is formed to be thinner than a second portion 19e other than the first portion 19d. Specifically, a plating growth stopping surface 19c is provided in the first portion 19d in the electroless plating step, whereby plating growth can be suppressed. As a result, the first portion 19d can be made thinner than the second portion 19e. The thickness of the first portion 19d can be determined by adjusting the interval of the gap 18a of the power supply layer 18 and the taper angle of the edge portion 19b of the tapered metal mask 19. FIG. 15 shows an aspect in which the tapered metal mask 19 according to this modification is completed.

Figure 16:
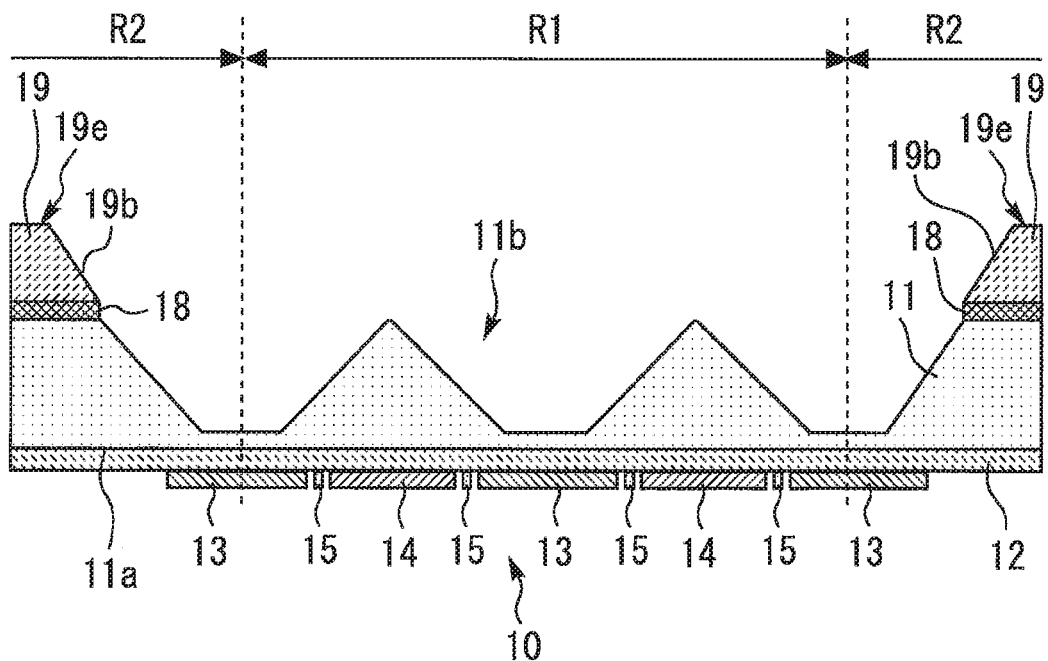
FIG. 16 is a diagram showing the method of manufacturing the semiconductor device according to the modification of the first embodiment of the present invention.
Figure 17:
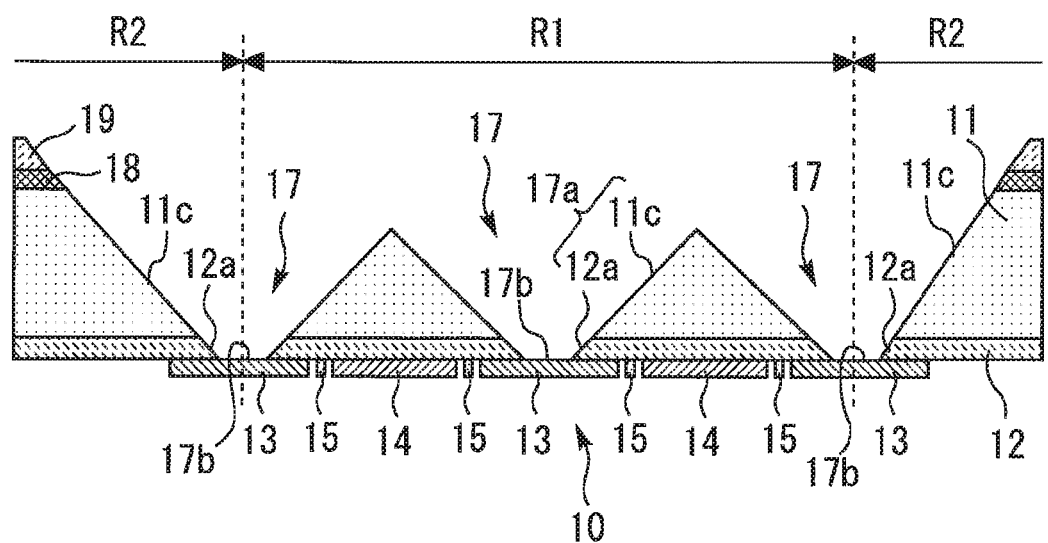
FIG. 17 is a diagram showing the method of manufacturing the semiconductor device according to the modification of the first embodiment of the present invention.
Figure 18:
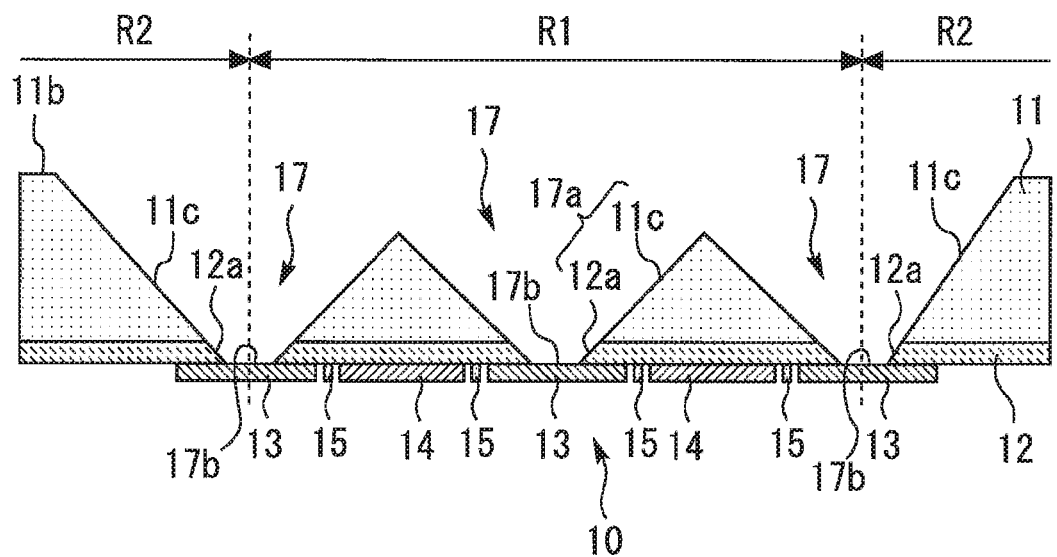
FIG. 18 is a diagram showing the method of manufacturing the semiconductor device according to the modification of the first embodiment of the present invention.
Figure 19:
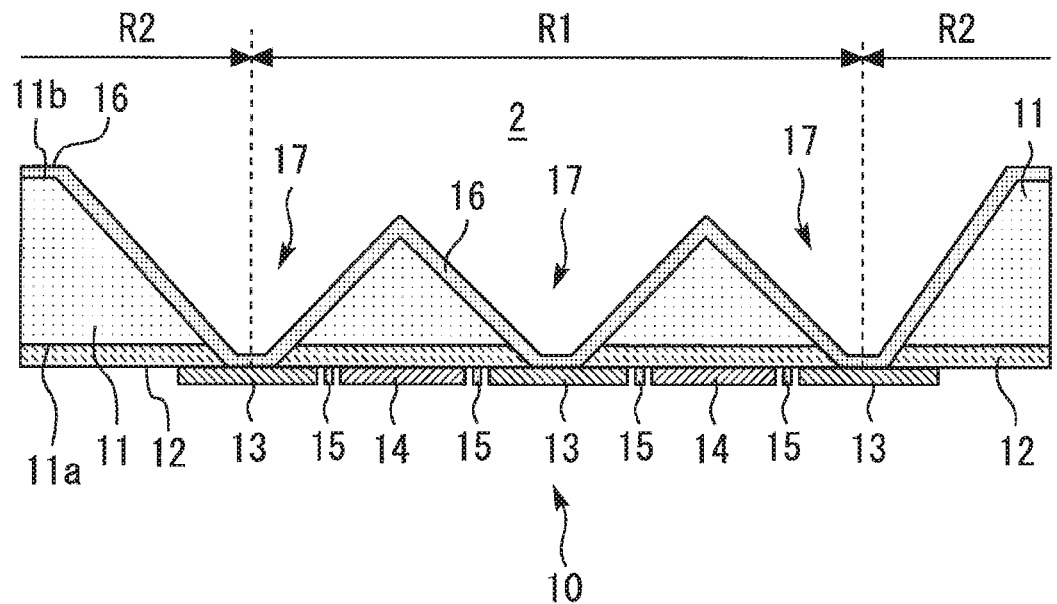
FIG. 19 is a diagram showing the method of manufacturing the semiconductor device according to the modification of the first embodiment of the present invention.

The dry etching step of step S108 will be described while dividing the dry etching step into a portion in the middle of dry etching shown in FIG. 16 and a portion at the completion time of the dry etching shown in FIG. 17. In the dry etching step of step S108, the dry etching is continued even after the first portion 19d disappears. As a result, as shown in FIG. 16, the first portion 19d disappears and the second portion 19e remains in the middle of the dry etching of the compound substrate 11 (step S108a). By further advancing the dry etching, a structure at the completion time of the dry etching shown in FIG. 17 is obtained. As shown in FIG. 17, the first region R1 just under the first portion 19d on the back surface 11b of the compound substrate 11 can be made thinner than the second region R2 just under the second portion 19e on the back surface 11b (step S108b).

Thereafter, the metal mask removing step (FIG. 18) of step S110 and the backside metal forming step (FIG. 19) of step S112 are performed. According to the structure shown in FIG. 19, as described with reference to FIG. 4 in the first embodiment, the distance between the heat generation site P and the backside metal 16 can be shortened. Accordingly, the heat dissipation of the semiconductor device 2 can be improved.

Figure 20:
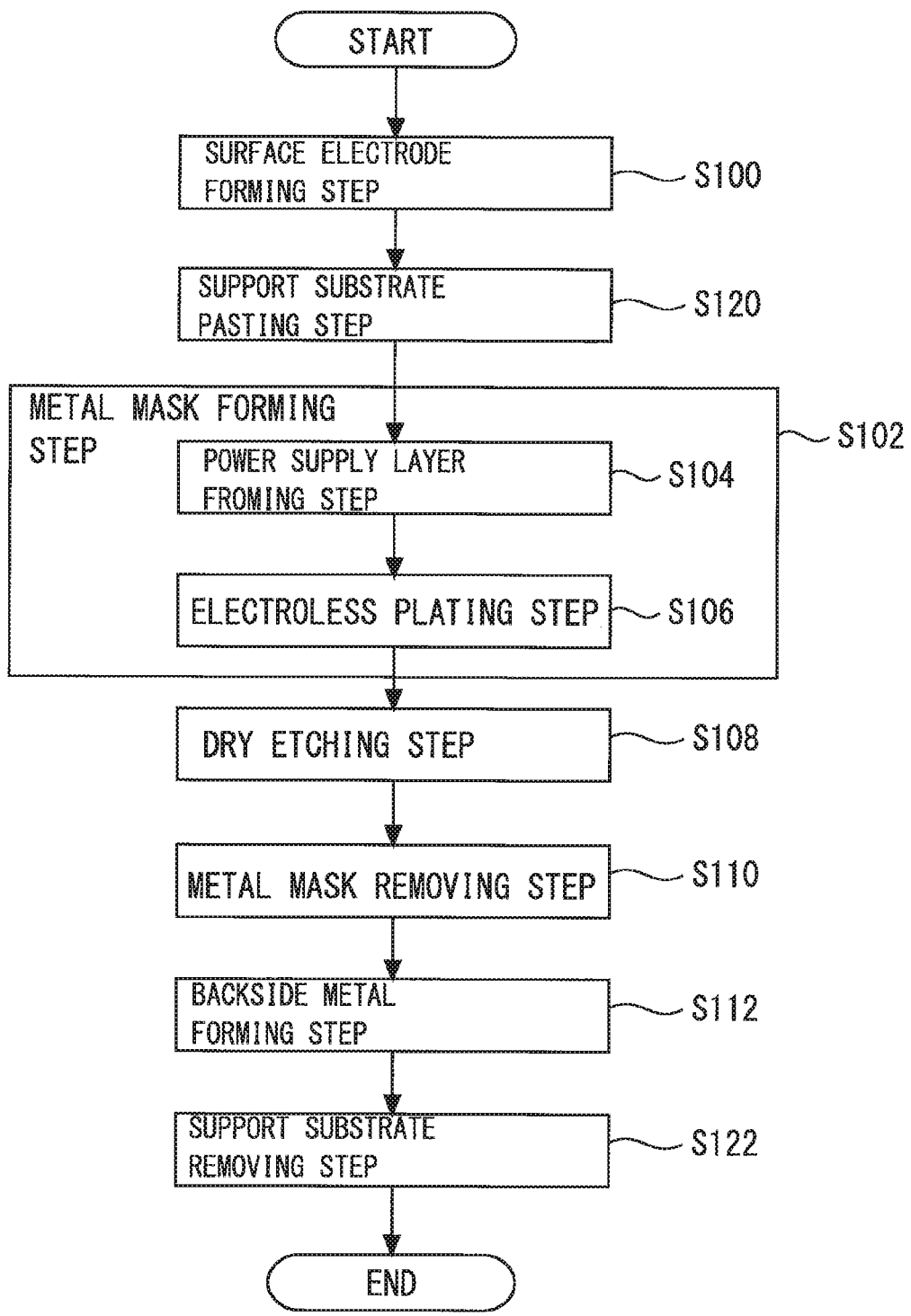
FIG. 20 is a flowchart showing the method of manufacturing the semiconductor device according to the modification of the first embodiment of the present invention.

FIG. 20 is a flowchart showing a method of manufacturing a semiconductor device according to a modification of the first embodiment of the present invention. FIGS. 21 to 28 are diagrams showing the method of manufacturing the semiconductor device according to the modification of the first embodiment of the present invention. The present modification described with reference to FIGS. 20 to 28 utilizes a support substrate 26 in the method of manufacturing the semiconductor device. In the manufacturing method according to the present modification, in the flowchart described with reference to FIG. 6, a support substrate pasting step (step S120) is added between a surface electrode forming step and the metal mask forming step, and a support substrate exfoliating step (S122) is added after the backside metal forming step. The support substrate pasting step is a step of pasting the support substrate 26 to the surface 11a side of the compound substrate 11 with adhesive agent 25. In the first embodiment, since the semiconductor layer 12 is formed on the surface 11a of the compound substrate 11, the support substrate 26 is pasted to the semiconductor layer 12. However, when the semiconductor layer 12 is omitted, the support substrate 26 may be directly pasted to the surface 11a of the compound substrate 11. The support substrate exfoliating step is a step of removing the support substrate 26 from the compound substrate 11.

Figure 21:
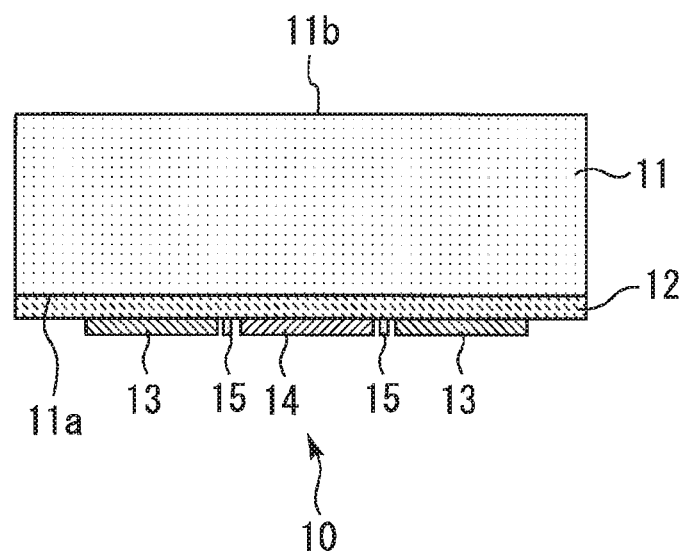
FIG. 21 is a diagram showing the method of manufacturing the semiconductor device according to the modification of the first embodiment of the present invention.
Figure 22:
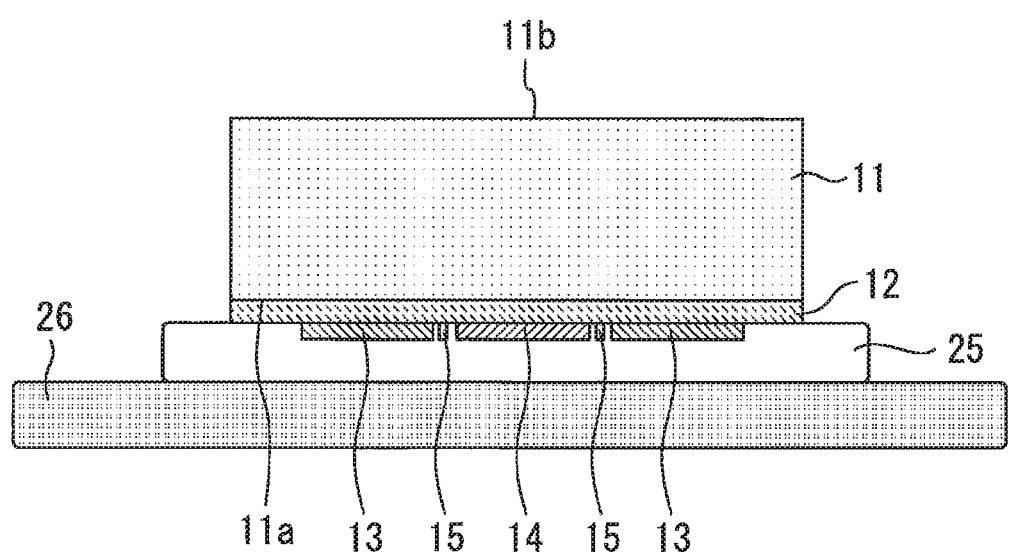
FIG. 22 is a diagram showing the method of manufacturing the semiconductor device according to the modification of the first embodiment of the present invention.

In the flowchart shown in FIG. 20, as shown in FIG. 21, the surface electrode forming step (step S100) is first performed. Thereafter, as shown in FIG. 22, the support substrate pasting step (step S120) is performed. In the support substrate pasting step, the support substrate 26 is pasted to the surface 11a side of the compound substrate 11 via the adhesive agent 25 coated on the surface 11a of the compound substrate 11. The support substrate 26 makes it possible to not only facilitate transportation of the thinned compound substrate 11, but also prevent warpage and cracking of the compound substrate 11. A resist, organic resin, wax or the like may be used as the adhesive agent 25. The adhesive agent 25 is used for the purpose of securing adhesion and for the purpose of protecting the surface 11a side of the semiconductor device 1. It is preferable that a compound substrate of Si, SiC, sapphire, glass or the like which has sufficient mechanical strength is used as the support substrate 26.

Figure 23:
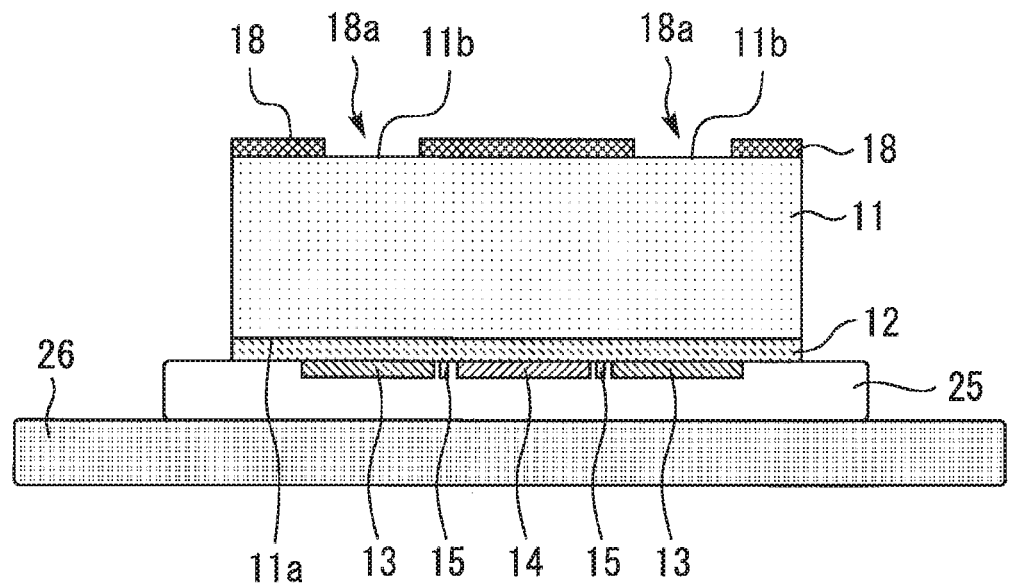
FIG. 23 is a diagram showing the method of manufacturing the semiconductor device according to the modification of the first embodiment of the present invention.
Figure 24:
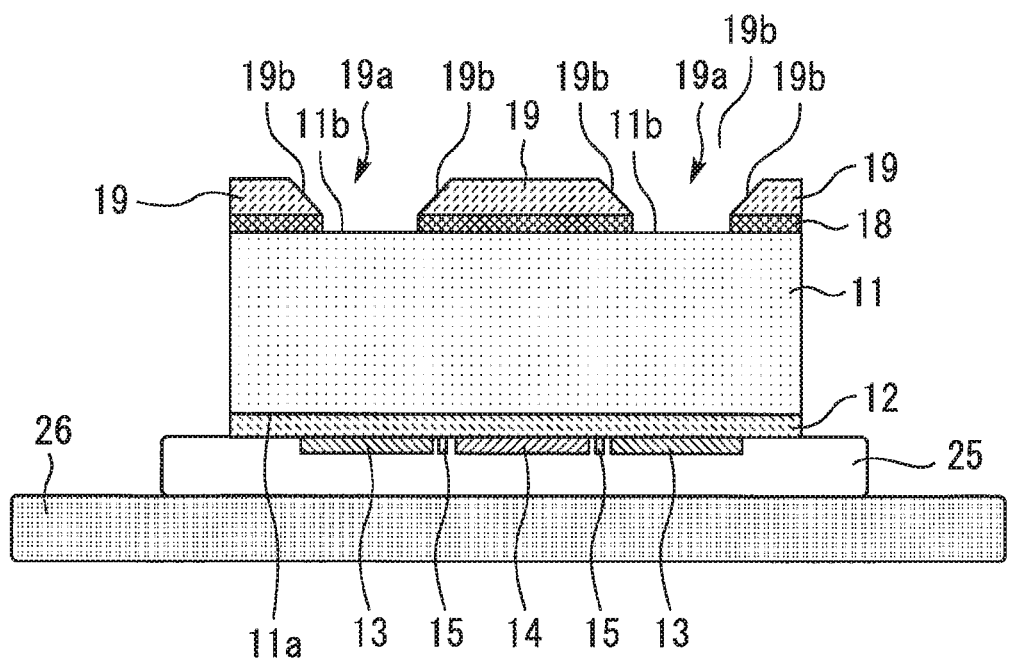
FIG. 24 is a diagram showing the method of manufacturing the semiconductor device according to the modification of the first embodiment of the present invention.

Next, the power supply layer forming step (step S104) shown in FIG. 23 and the electroless plating step (step S106) shown in FIG. 24 are performed to form the tapered metal mask 19. When the tapered metal mask 19 is formed on the power supply layer 18, it is desirable that the temperature of the electroless plating solution is a low temperature of 100° C. or less. This is to prevent dissolution of the adhesive agent 25. If high temperature baking over 100° C. is performed to cause thermal drip in the resist, which causes a risk that the adhesive agent 25 may be dissolved and the compound substrate 11 may be exfoliated from the support substrate 26.

Figure 25:
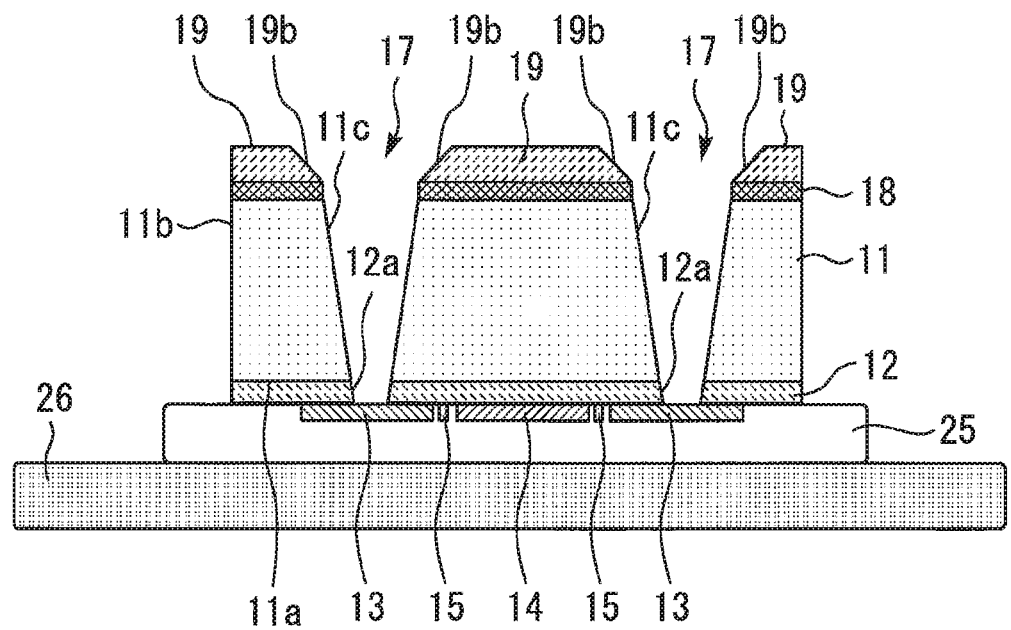
FIG. 25 is a diagram showing the method of manufacturing the semiconductor device according to the modification of the first embodiment of the present invention.
Figure 26:
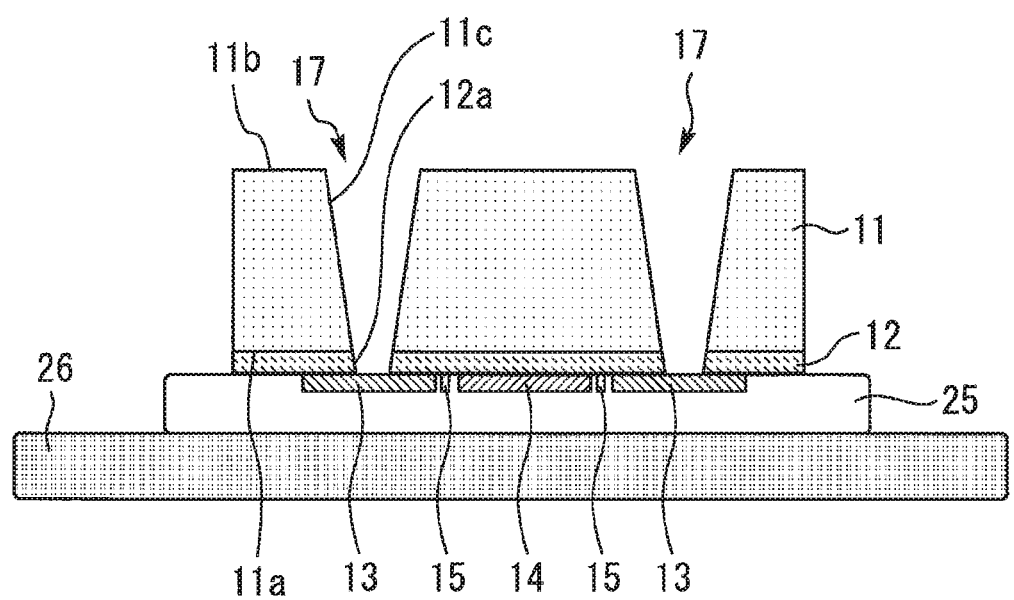
FIG. 26 is a diagram showing the method of manufacturing the semiconductor device according to the modification of the first embodiment of the present invention.
Figure 27:
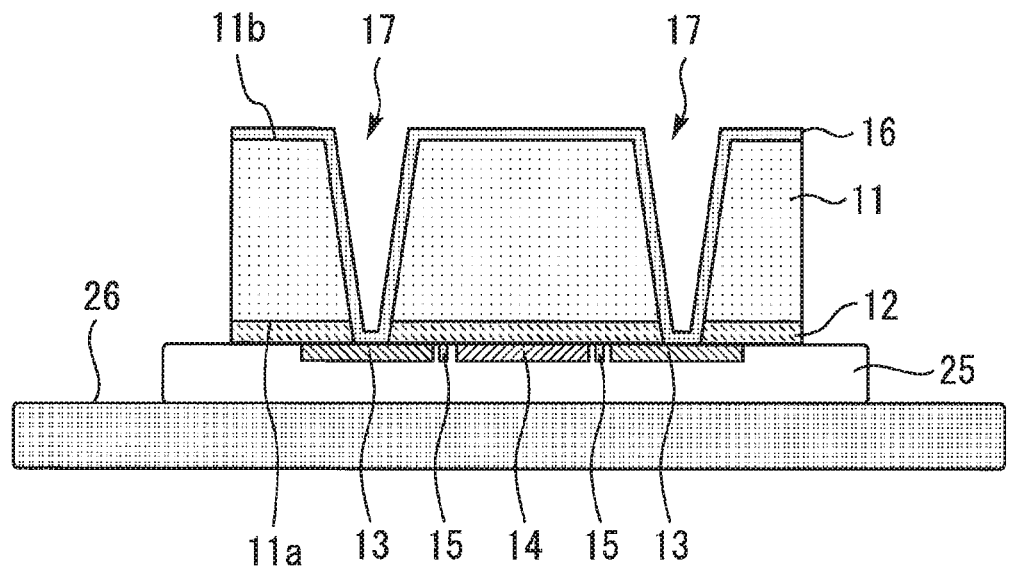
FIG. 27 is a diagram showing the method of manufacturing the semiconductor device according to the modification of the first embodiment of the present invention.

Next, as shown in FIG. 25, the dry etching step (step S108) is performed. It is desirable that dry etching is performed at a low temperature of 100° C. or less. This is to prevent dissolution of the adhesive agent 25. Next, the metal mask removing step (step S110) shown in FIG. 26 and the backside metal forming step (step S112) shown in FIG. 27 are performed.

Figure 28:
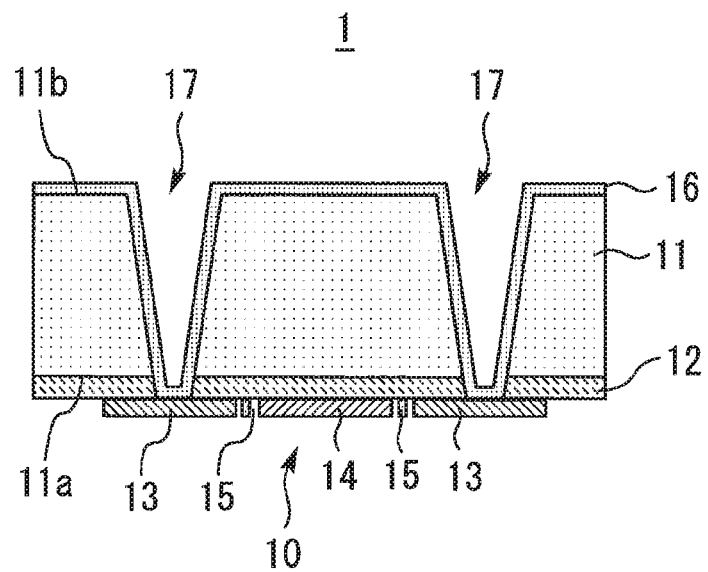
FIG. 28 is a diagram showing the method of manufacturing the semiconductor device according to the modification of the first embodiment of the present invention.

Next, the support substrate exfoliating step (step S122) is performed. Specifically, the adhesive agent 25 is dissolved, and the support substrate 26 is exfoliated from the compound substrate 11 as shown in FIG. 28.

In the first embodiment, the tapered via holes 17 are formed by performing dry etching until the tapered via holes 17 penetrate the compound substrate 11. However, by terminating the dry etching before the tapered via holes 17 has penetrated the compound substrate 11, it is also possible to form a tapered trench (Tapered Trench) 105 shown in FIG. 29 or a tapered mesa 214 shown in FIGS. 30 and 31. The tapered via hole 17, the tapered trench 105, and the tapered mesa 214 are collectively referred to as "tapered groove" for convenience's sake.

Figure 29:
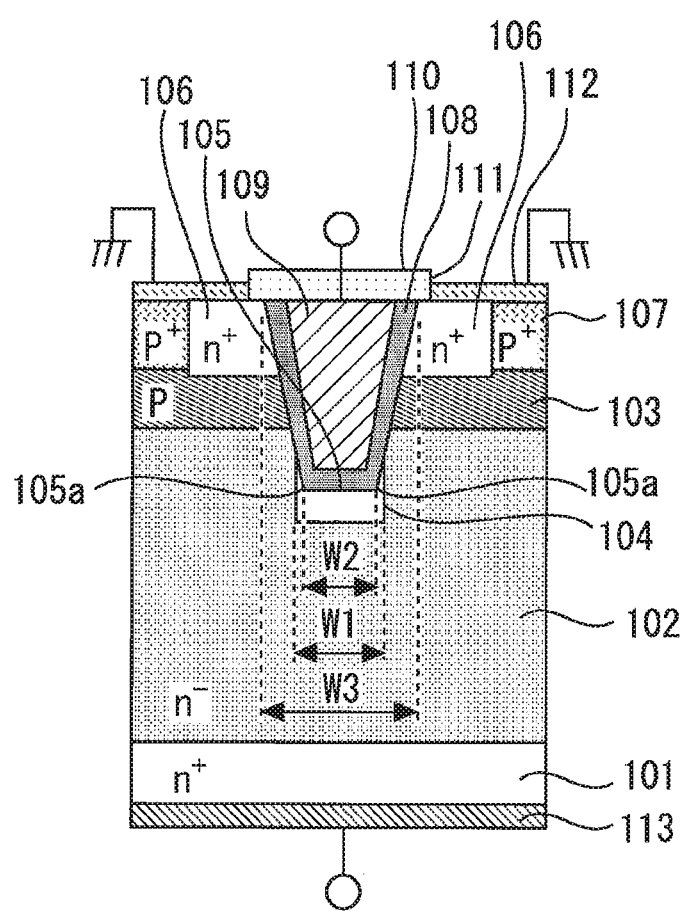
FIG. 29 is a diagram showing a semiconductor device having a tapered trench manufactured by the method of manufacturing the semiconductor device according to the first embodiment of the present invention.

FIG. 29 is a diagram showing a semiconductor device 4 having a tapered trench 105 manufactured by the method of manufacturing the semiconductor device according to the first embodiment of the present invention. The manufacturing method according to the first embodiment can also be used in a method for manufacturing a trench structure of a vertical MOSFET of a power device, for example.

The semiconductor device 4 shown in FIG. 29 is a silicon carbide semiconductor device having a reverse type MOSFET. In the semiconductor device 4, a channel region is formed on a surface portion of a base region 103 located on the side surface of the tapered trench 105 by controlling a voltage applied to a gate electrode 109. Formation of the channel region causes current to flow between a first electrode 112 and a second electrode 113 through a source region 106 and a drift layer 102. In the tapered trench 105, the width of an entrance on the surface side of the drift layer 102 is represented by W3, and the width of a bottom portion is represented by W2. The bottom portion width W2 is smaller than the entrance width W3. A deep layer 104 is provided below the bottom portion of the tapered trench 105 in the drift layer 102. The deep layer 104 has a width W1 larger than the bottom portion width W2. The deep layer 104 is arranged to be away from the base region 103 while surrounding both corner portions 105a of the tapered trench 105.

Formation of the tapered trench 105 can be implemented by applying the manufacturing method according to the first embodiment. Specifically, the tapered metal mask 19 formed by electroless plating is formed on an n-type semiconductor layer 102 which is the drift layer 102, an n$^+$-type source region 106, and a body p-type layer 107. Dry etching is performed from an upper side of the tapered metal mask 19. As a result, the side wall of the tapered trench 105 can be tapered, and the bottom portion width W2 can be made smaller than the entrance width W3 of the tapered trench 105.

Here, description will be made while referring to a related art related to the method of forming the trench structure. As the related art is known such a method that the etching mask is formed on the n-type semiconductor layer 102, the n$^+$-type source region 106, and the body p-type layer 107, and then the etching mask is opened in a region where the tapered trench 105 is scheduled to be formed. There is known a related art in which isotropic etching is performed after anisotropic etching using this etching mask is performed, whereby the entrance width W3 of the tapered trench 105 is made large, the bottom width W2 is made small, and the side wall of the tapered trench 105 is tapered. However, there is a problem that the shape of the tapered trench 105 obtained by this related art has a large variation and reproducibility of the shape is poor. In order to suppress the concentration of electric field in the tapered trench 105 under application of electric field, it is preferable to suppress the variation in the shape of the trench. In this respect, by using the manufacturing method according to the first embodiment, the tapered trench structure influencing the drain withstand voltage can be formed with good reproducibility. Therefore, the gate insulating film 108 can be prevented from being broken under a high voltage.

Figure 30:
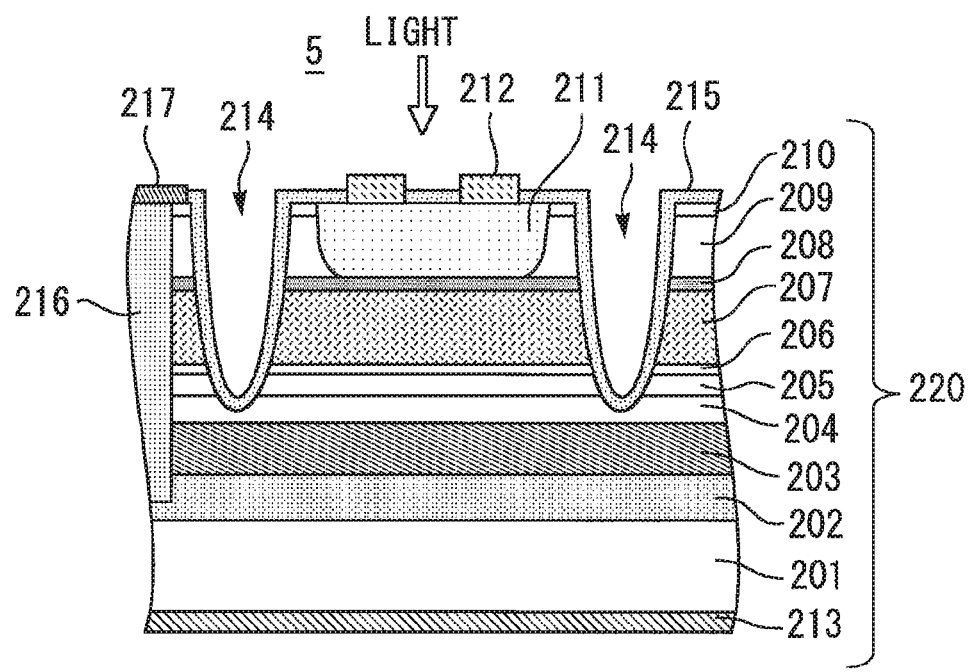
FIG. 30 is a diagram showing a semiconductor device having tapered mesas manufactured by the method of manufacturing a semiconductor device according to the first embodiment of the present invention.
Figure 31:
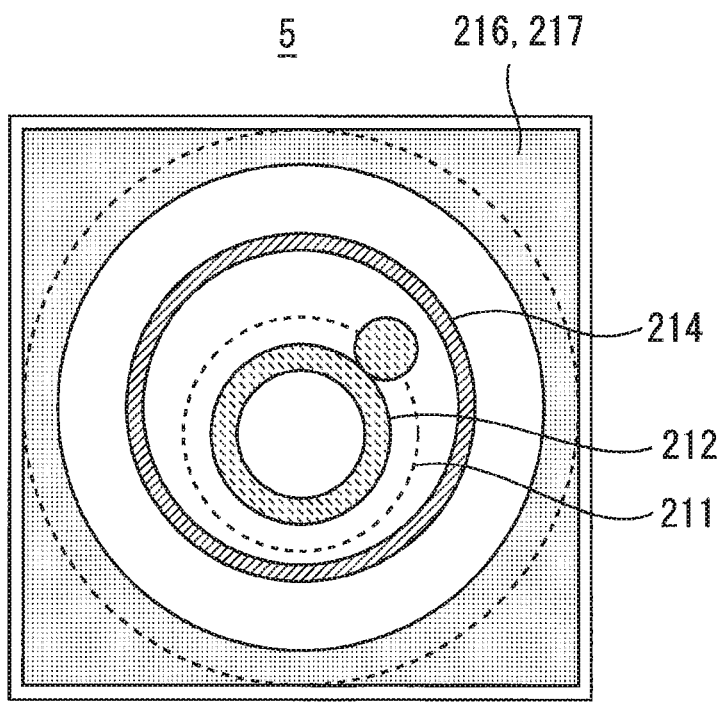
FIG. 31 is a diagram showing a semiconductor device having tapered mesas manufactured by the method of manufacturing a semiconductor device according to the first embodiment of the present invention.

FIGS. 30 and 31 are diagrams showing a semiconductor device 5 having tapered mesas 214 manufactured by the method of manufacturing a semiconductor device according to the first embodiment of the present invention. The manufacturing method according to the first embodiment can be also used in a method for manufacturing a mesa structure of a semiconductor light receiving element, for example. The semiconductor device 5 is a semiconductor light receiving element, and specifically, is a light receiving element for a high-speed and long-distance wavelength multiplexing system of 10 Gb/s and 80 km or more in transmission distance. FIG. 30 is a cross-sectional view showing the semiconductor device 5, and FIG. 31 is a plan view of the semiconductor device 5. In FIG. 31, the semiconductor device 5 is viewed from the light receiving surface side.

As shown in FIG. 30, an InGaAs light absorption layer 202, a multiple reflection layer 203, an InP barrier layer 204, an AlInAs multiplication layer 205, a p-type InP electric field mitigation layer 206, an InGaAs light absorption layer 207, an InGaAsP graded layer 208, an InP window layer 209, and an InGaAs contact layer 210 are sequentially stacked on an n-type InP compound substrate 201. Hereinafter, for conveniences sake, the n-type InP compound substrate 201 and the layers stacked on the n-type InP compound substrate 201 are collectively referred to as "compound semiconductor substrate 220".

The InP window layer 209 and the InP barrier layer 204 have a larger band gap than the InGaAs light absorption layers 202 and 207. The multiple reflection layer 203 includes an InP layer and an InGaAs layer. The InGaAs light absorption layers 202 and 207 are not limited to InGaAs, but may be InGaAsP and AlGaInAs or the like. The InP barrier layer 204 is not limited to InP, but may be AlInAs, AlGaInAs, InGaAsP or the like. The InP barrier layer 204 may be omitted.

A p-type impurity diffusion region 211 which is a light receiving region is provided in a part of the InP window layer 209. An anode electrode 212 is provided on the p-type impurity diffusion region 211, and has an opening through which light is incident. A cathode electrode 213 is provided on the lower surface of the n-type InP compound substrate 201. The tapered mesa 214 is provided in the InGaAs light absorption layer 207 and the InP window layer 209 outside the p-type impurity diffusion region 211. A nonreflective film 215 made of a SiN film is provided on the InGaAs contact layer 210 and on the inner wall of the tapered mesa 214. The nonreflective film 215 also serves as a surface protective film.

A p-type impurity diffusion region 216 is provided in the InGaAs light absorption layer 202, the multiple reflection layer 203, the InGaAs light absorption layer 207, and the InP window layer 209 on an opposite side to the p-type impurity diffusion region 211 with respect to the tapered mesa 214. In the semiconductor device 5, the p-type impurity diffusion region 216 is provided wholly outside the tapered mesa 214. A metal film 217 is provided on the entire surface of the p-type impurity diffusion region 216.

The p-type impurity diffusion region 216 reaches the InGaAs light absorption layer 202, and the metal film 217 is connected to the InGaAs light absorption layer 202 via the p-type impurity diffusion region 216. The metal film 217 is not electrically connected to the anode electrode 212 and the cathode electrode 213.

In order to form the tapered mesa 214 on the compound semiconductor substrate 220, the manufacturing method of the first embodiment can be used. First, a SiN film is funned on the InGaAs contact layer 210 in order to suppress the plating reaction. Next, a pattern of the power supply layer 18 is formed on the SiN film. Furthermore, the tapered metal mask 19 is formed by the electroless plating solution having the catalyst poison. Thy etching is performed from an upper side of the tapered metal mask 19 to form the tapered mesa 214. After the tapered mesa 214 is formed, the nonreflective film 215 is formed to protect the surface of the semiconductor device 5. Note that the tapered mesa 214 has a ring-like shape in plan view shown in FIG. 31.

It is desirable to clean the surface of the tapered mesa 214 after formation of the tapered mesa 214 and before formation of the nonreflective film 215. This is because when the residue of the tapered metal mask 19 remains in the tapered mesa 214, it causes leakage. As a cleaning method, light etching may be performed on the semiconductor in the tapered mesa 214 by dry etching or wet etching. Alternatively, physical cleaning methods such as ultrasonic cleaning, spray cleaning, and cryogenic aerosol cleaning may be used.

A wet etching method using hydrochloric acid-based, hydrogen bromide-based or bromine-based etching solution is generally known as a related art for forming a tapered mesa 214 in a semiconductor layer. This is because use of these wet etching solutions makes it possible to perform isotropic etching and form a tapered mesa structure. However, the aforementioned wet etching solution is a diffusion-controlled etching solution, and has a disadvantage that the etching rate greatly varies due to convection of the solution in an etching container. This disadvantage causes a problem that dimensional controllability of the tapered mesa is low. On the other hand, in the first embodiment, dry etching having excellent dimensional controllability is performed by using the tapered metal mask 19. Therefore, the tapered mesa groove can be formed with good reproducibility.

The first embodiment and the modification according to the first embodiment which are applied to the tapered via hole 17 can be applied to the tapered trench 105 and the tapered mesa 214. For example, in the tapered trench 105 and the tapered mesa 214, the taper angle formed by the inner wall surface and the bottom surface may be also equal to 92 to 160 degrees. Note that even when a stripe structure of a laser diode is formed, the manufacturing method according to the foregoing modification of the first embodiment may be used. The tapered mesa 214 formed in the compound substrate 11 can be configured to have the stripe structure of the laser diode.

The tapered trench 105 and the tapered mesa 214 are grooves provided in the n-type semiconductor layer 102 or the compound semiconductor substrate 220. The tapered trench 105 and the tapered mesa 214 have such a forward tapered shape that the width at a position of the groove is smaller as the position of the groove is deeper. The inner wall surface of the tapered trench 105 is covered with the gate insulating film 108, and the inner wall surface of the tapered mesa 214 is covered with the nonreflective film 215. However, the films covering the inner walls of the tapered trench and the tapered mesa are not limited to the insulating film and the protective film. As a modification, the inner wall surfaces of other tapered trench and tapered mesa formed by the manufacturing method according to the first embodiment may be covered with a metal film or a semiconductor film.

Figure 32:
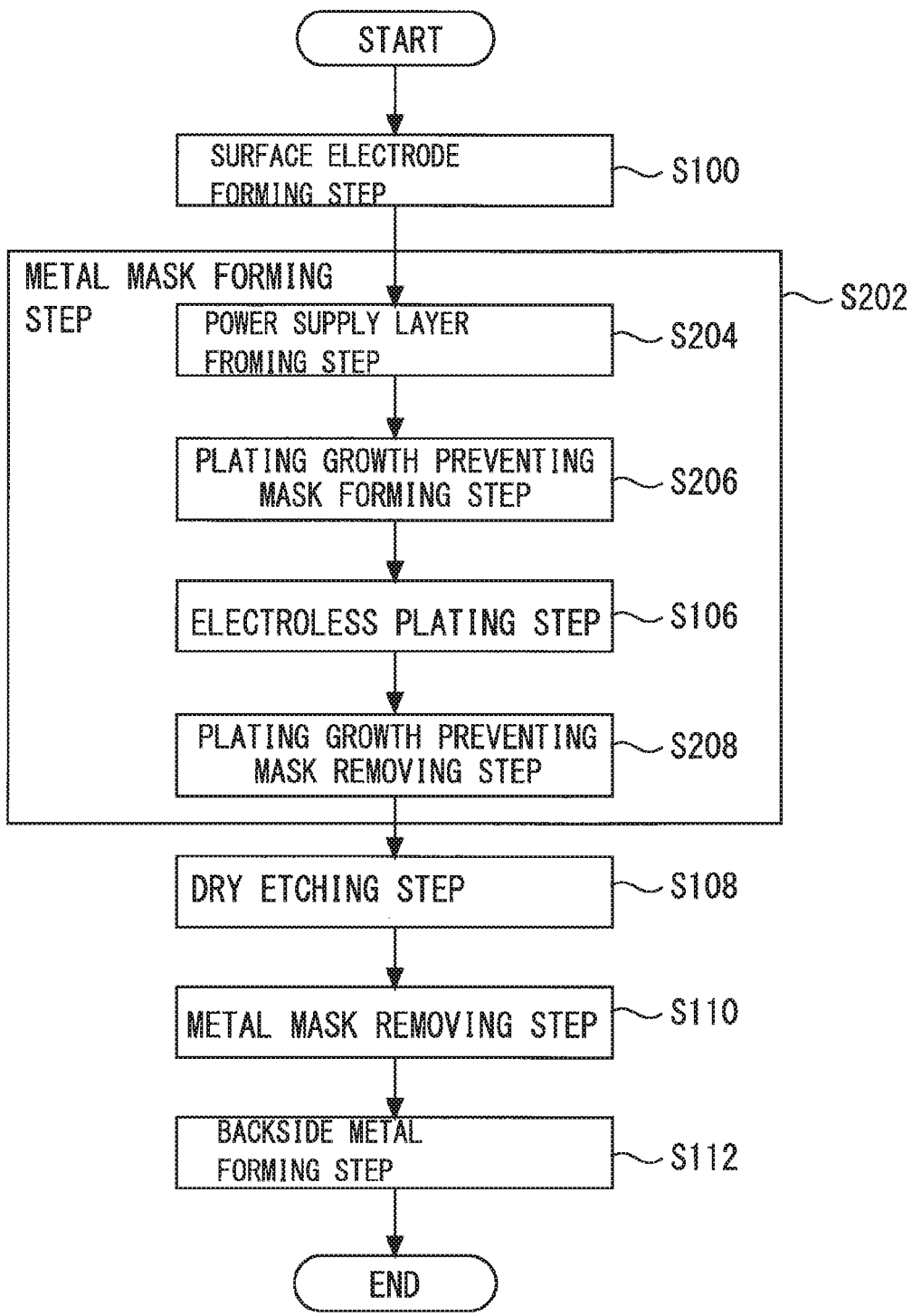
FIG. 32 is a flowchart showing a method of manufacturing a semiconductor device according to a modification of the first embodiment of the present invention.
Figure 33:
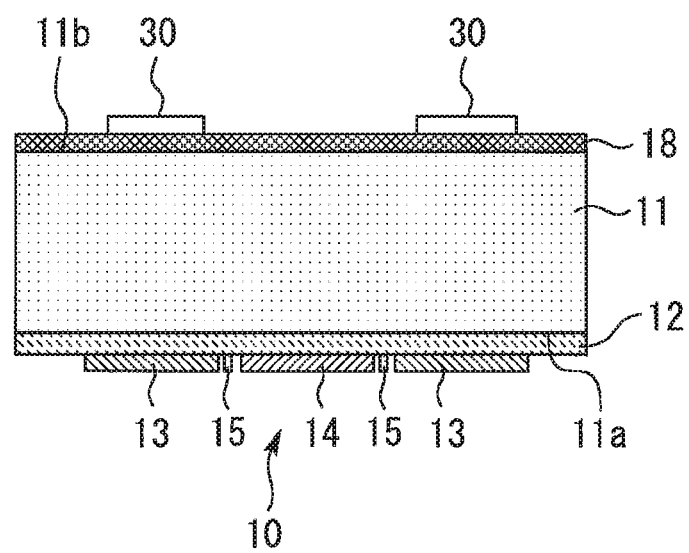
FIG. 33 is a diagram showing the method of manufacturing the semiconductor device according to the modification of the first embodiment of the present invention.
Figure 34:
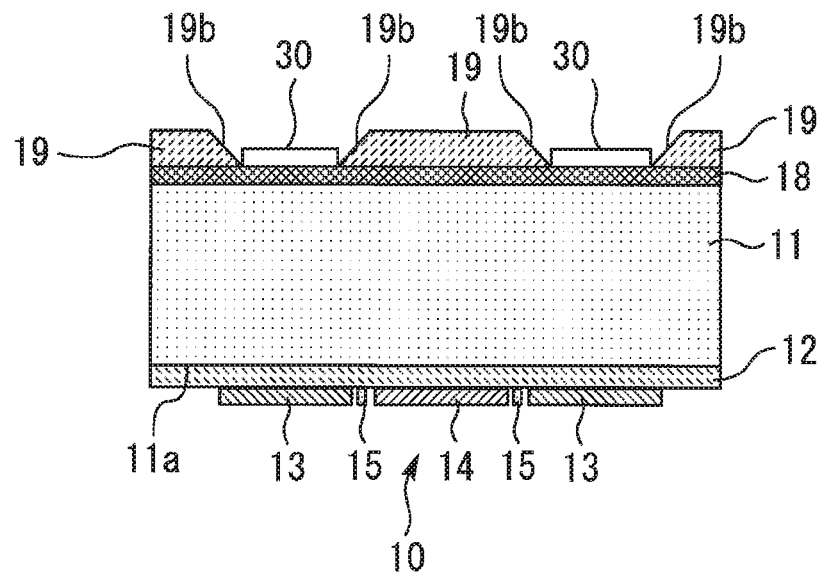
FIG. 34 is a diagram showing the method of manufacturing the semiconductor device according to the modification of the first embodiment of the present invention.
Figure 35:
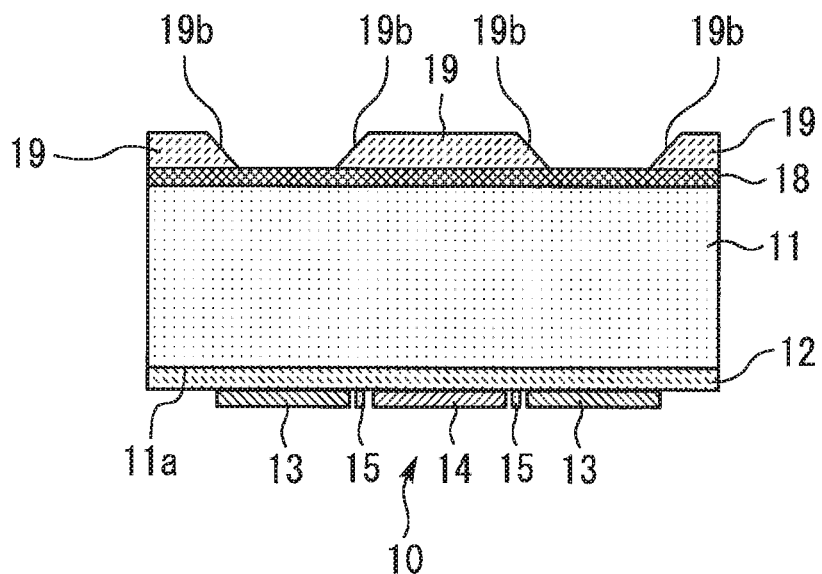
FIG. 35 is a diagram showing the method of manufacturing the semiconductor device according to the modification of the first embodiment of the present invention.

FIG. 32 is a flowchart showing a method of manufacturing a semiconductor device according to a modification of the first embodiment of the present invention. FIGS. 33 to 35 are diagrams showing the method of manufacturing the semiconductor device according to the modification of the first embodiment of the present invention. The present modification shown in FIG. 32 has step S202 in place of step S102 in the flowchart of FIG. 6. In the metal mask forming step according to step S202, a plating growth preventing mask 30 is used.

In the flowchart of FIG. 32, the surface electrode forming step according to step S100 is first performed.

Next, the metal mask forming step (step S202) is performed. The metal mask forming step includes a power supply layer forming step (step S204), a plating growth preventing mask forming step (step S206), the electroless plating step (step S106), and a plating growth preventing mask removing step (step S208).

First, in the power supply layer forming step (step S204), the power supply layer 18 is provided on the entire back surface 11b of the compound substrate 11. In step S204 according to the present modification, the entire back surface 11b is covered with the power supply layer 18. This point is different from the step (see FIG. 8) in which the gaps 18a are provided in the power supply layer 18 in step S104 of the flowchart of FIG. 6.

Next, in the plating growth preventing mask forming step (step S206), as shown in FIG. 33, a part of the power supply layer 18 is covered with the plating growth preventing mask 30. The plating growth preventing mask 30 is formed of a resist. The plating growth is suppressed only at a portion of the power supply layer 18 which is covered with the plating growth preventing mask 30.

Next, in the electroless plating step, the tapered metal mask 19 is formed as shown in FIG. 34 by the same method as step S106 described with reference to FIG. 6.

Next, in the plating growth preventing mask removing step (step S208), after the tapered metal mask 19 is formed, the plating growth preventing mask 30 is removed. As shown in FIG. 35, the power supply layer 18 is exposed by removing the plating growth preventing mask 30.

Thereafter, as in the case of the flowchart described with respect to FIG. 6, the dry etching step (step S108), the metal mask removing step (step S110), and the backside metal forming step (step S112) are performed in this order.

When a resist is used as a mask under plating, it is desirable that the thickness of the resist is suppressed to be a film thickness which is sufficiently thinner than the tapered metal mask 19. For example, the film thickness is equal to 2 μm or less. When the film thickness exceeds this range, it is difficult to form the edge portion 19b of the tapered metal mask 19 in a tapered shape. That is, it is preferable to perform the electroless plating step until the tapered metal mask 19 becomes thicker than the plating growth preventing mask 30. The plating growth preventing mask 30 may be formed of, not a resist, but an insulating film of SiO and SiN, etc. The tapered metal mask 19 may be formed to be twice to 10 times as thick as the plating growth preventing mask 30, whereby the edge portion 19b of the tapered metal mask 19 can be sufficiently tapered.

Note that the plating growth preventing mask removing step (step S208) may be omitted. In this case, after step S106, the processing proceeds to step S108 to perform dry etching. As a result, the plating growth preventing mask 30 may be etched by dry etching, and continuously the power supply layer 18 and the compound substrate 11 may be subjected to dry etching.

Second Embodiment

Figure 36:
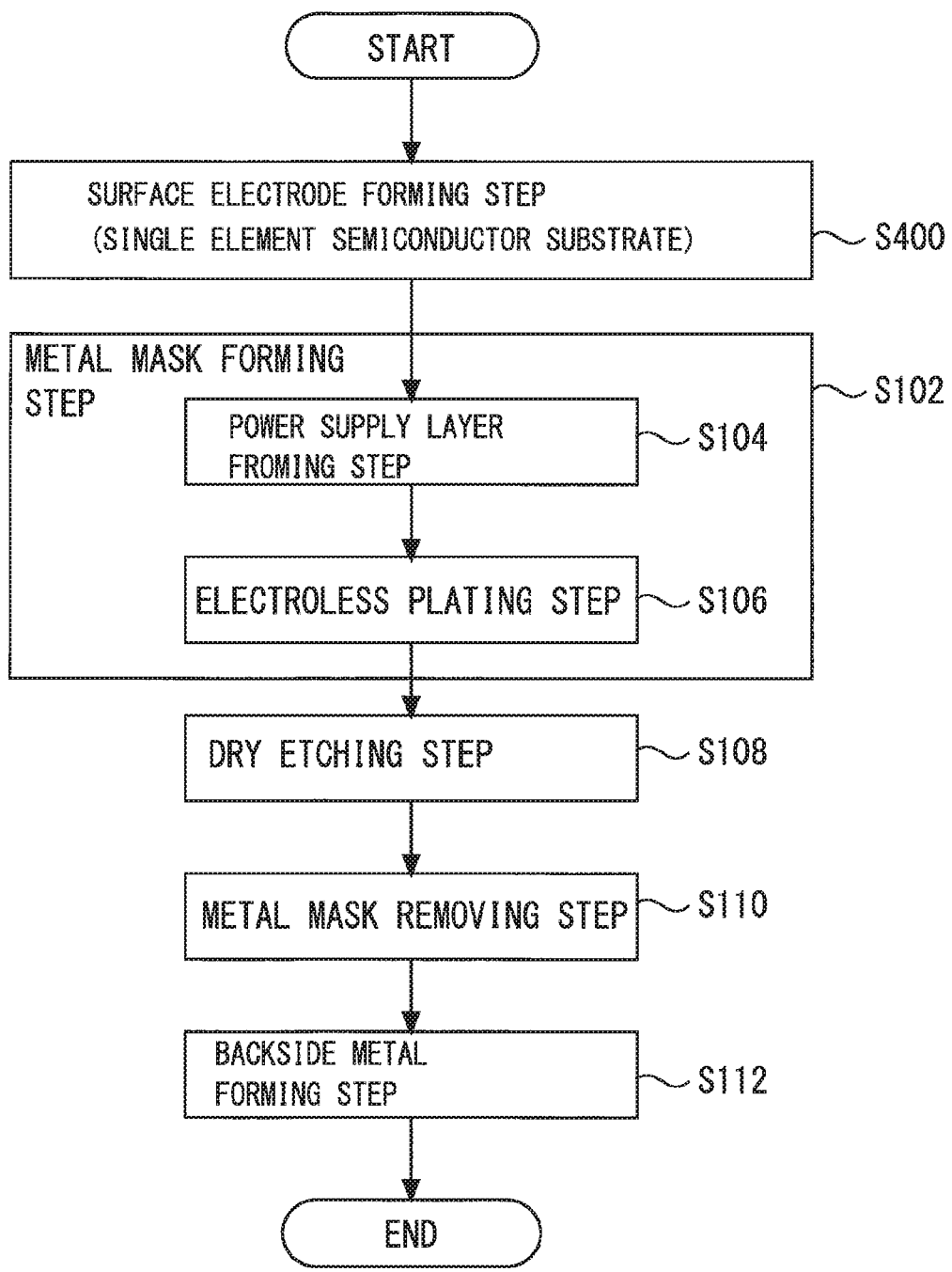
FIG. 36 is a flowchart showing a method of manufacturing a semiconductor device according to a fourth embodiment of the present invention.

In the manufacturing method according to the first embodiment, a single element semiconductor substrate 311 may be used instead of the compound substrate 11. FIG. 36 is a flowchart showing a method of manufacturing a semiconductor device according to a fourth embodiment of the present invention. In step S100 of the first embodiment, the compound substrate 11 is prepared and subjected to the surface electrode forming step. On the other hand, in a second embodiment, a single element semiconductor substrate 311 is prepared and subjected to the surface electrode forming step (step S400). The other steps are the same as the first embodiment. The various modifications described in the first embodiment can be likewise applied to the second embodiment.

Figure 37:
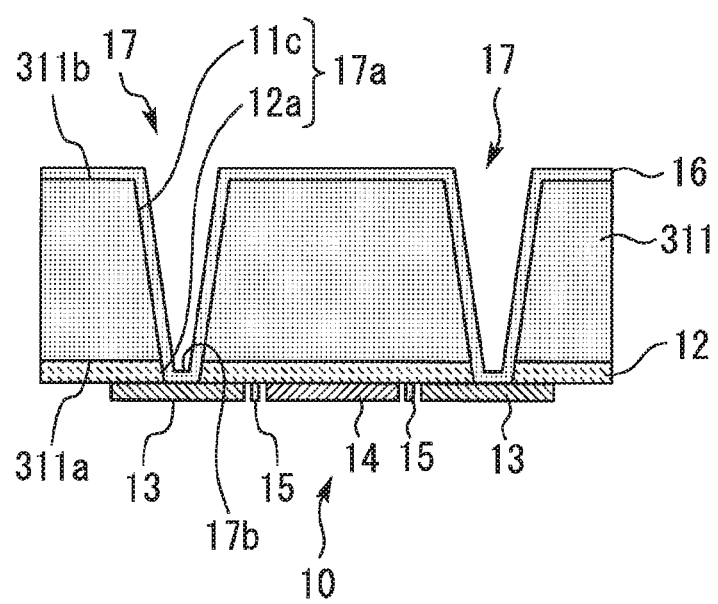
FIG. 37 is a cross-sectional view showing a semiconductor device according to the second embodiment of the present invention.

FIG. 37 is a cross-sectional view showing a semiconductor device 301 according to the second embodiment of the present invention. In the semiconductor device 301 according to the second embodiment, the compound substrate 11 is replaced with a single element semiconductor substrate 311 in the semiconductor device 1 according to the first embodiment. The material of the single element semiconductor substrate 311 is, for example, Si, Ge, etc. which are group IV semiconductors. The single element semiconductor substrate 311 has a front surface 311a and a back surface 311b, and tapered via holes 17 penetrating the front surface 311a and the back surface 311b are provided as in the case of the first embodiment.

The various modifications described in the first embodiment can be likewise applied to the second embodiment, and various modifications can be made to the material, the structure, and the like. For example, the material variation of the source electrode 13, the drain electrode 14, the gate electrode 15, and the backside metal 16 is the same as that of the first embodiment. It is preferable that the taper angle $\theta_h$ is also equal to 92 to 160 degrees. Furthermore, by applying the modification shown in FIGS. 4 and 5, plural tapered via holes 17 adjacent to the single element semiconductor substrate 311 may be provided, and the first region R1 sandwiched by the plural tapered via holes 17 may be made thinner than the second region R2 other than the first region R1.

Figure 38:
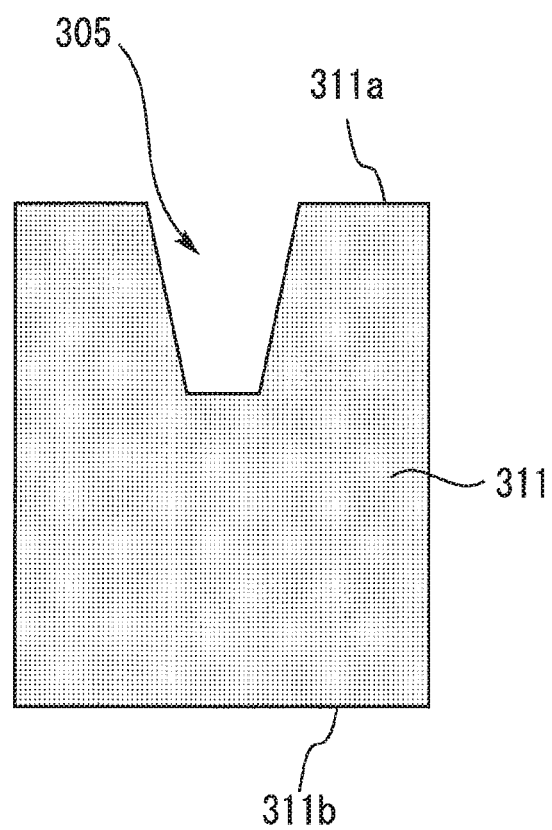
FIG. 38 is a cross-sectional view showing a tapered trench manufactured by the method of manufacturing a semiconductor device according to the second embodiment of the present invention.
Figure 39:
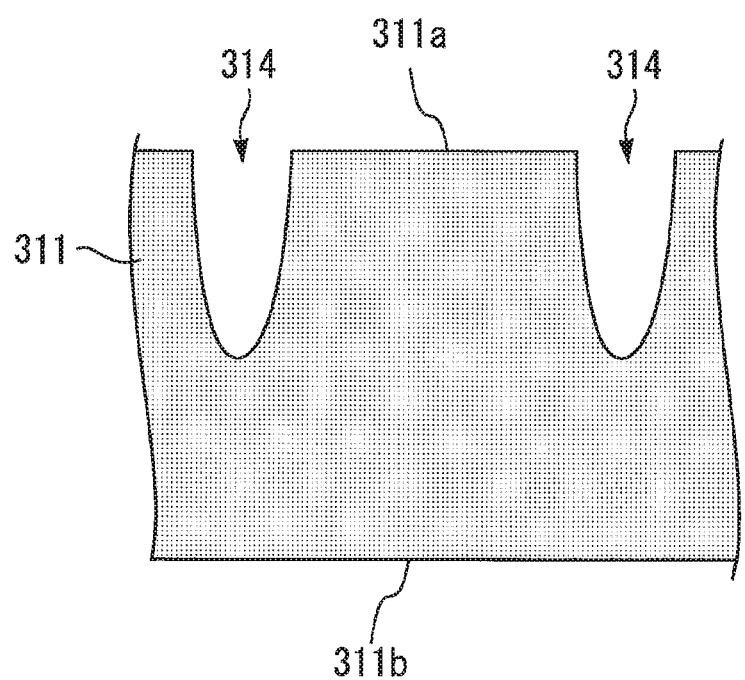
FIG. 39 is a cross-sectional view showing a tapered mesa manufactured by the method of manufacturing a semiconductor device according to the second embodiment of the present invention.

FIG. 38 is a cross-sectional view showing a tapered trench 305 manufactured by the method of manufacturing a semiconductor device according to the second embodiment of the present invention. FIG. 39 is a cross-sectional view showing a tapered mesa 314 manufactured by the method of manufacturing a semiconductor device according to the second embodiment of the present invention. In FIGS. 38 and 39, for convenience's sake, the top and bottom of the single element semiconductor substrate 311 are reversed. By terminating the dry etching step (step S108) before penetrating the single element semiconductor substrate 311, the tapered trench 305 may be formed on the front surface 311a side of the single element semiconductor substrate 311 as shown in FIG. 38. As shown in FIG. 39, the tapered mesa 314 may be formed on the front surface 311a side of the single element semiconductor substrate 311.

Although the expressions "front surface" and "back surface" are used in this specification, these terms are merely used to mean that one surface and a surface opposite to the one surface in one layer, one substrate, etc. are distinguished from each other. Accordingly, except for a case where the meaning of "front surface" and "back surface" is specifically limited in a particular embodiment or modification, the terms "front surface" and "back surface" may be merely replaced by the terms "a first surface" and "a second surface opposite to the first surface".

REFERENCE SIGNS LIST 1-5, 301 semiconductor device
10 transistor
11 compound substrate
11a front surface
11b back surface
11c wall surface of compound substrate
12 semiconductor layer
12a wall surface of semiconductor layer
13 source electrode
14 drain electrode
15 gate electrode
16 backside metal
17 tapered via hole
17a inner wall surface
17b bottom surface
18 power supply layer
18a gap
19 tapered metal mask
19a metal mask opening
19b edge portion
19d first portion
19e second portion
20 needle-like irregularity
21 minute metal body
25 adhesive agent
26 support substrate
30 plating growth preventing mask
102 n-type semiconductor layer (drift layer)
103 base region
104 deep layer
105, 305 tapered trench
105a both corner portion
106 n+ source region
107 p-type layer
108 gate insulating film
109 gate electrode
112 first electrode
113 second electrode
201 compound substrate
202, 207 light absorption layer
203 multiple reflection layer
204 barrier layer
205 multiplication layer
206 electric field mitigation layer
208 graded layers
209 window layer
210 contact layer
211 p-type impurity diffusion region
212 anode electrode
213 cathode electrode
214, 314 tapered mesa
215 nonreflective film
216 p-type impurity diffusion region
217 metal film
220 compound semiconductor substrate
311 single element semiconductor substrate

The invention claimed is:

1. A method of manufacturing a semiconductor device comprising:
   a metal mask forming step of forming a tapered metal mask having an opening on or above a back surface of a substrate, wherein the opening exposes a predetermined part in the back surface of the substrate, and an edge portion of the opening has a forward taper to the back surface;
   a dry etching step of performing, from an upper side of the tapered metal mask, dry etching on the edge portion of the opening and the substrate exposed from the opening, thereby forming a tapered groove on the substrate; and
   a metal mask removing step of removing the tapered metal mask, wherein
   the metal mask forming step includes:
      a power supply layer forming step of providing a power supply layer on the back surface of the substrate, wherein the power supply layer has a gap corresponding to the opening in the tapered metal mask; and
      an electroless plating to form an electroless plating film on the power supply layer as the tapered metal mask using an electroless plating solution containing a catalyst poison so that a first concentration of the catalyst poison above an outer edge of the predetermined part in the back surface of the substrate is higher than a second concentration of the catalyst poison above a region outside the predetermined part in the back surface of the substrate whereby a portion of the electroless plating film above the outer edge of the predetermined part is grown to have the forward taper, and a thickness of the region outside the predetermined part is determined by adjusting a width of the gap.

2. The method of manufacturing a semiconductor device according to claim 1, wherein the catalyst poison includes a substance selected from the group consisting of:

at least one kind of metal ions selected from the group consisting of lead, bismuth, antimony, tellurium and copper ions;

a sulfur compound;

a nitrogen compound;

polyethylene glycol; and acetylenic-based alcohol.

3. The method of manufacturing a semiconductor device according to claim 2, wherein the electroless plating solution contains 0.1 to 40 mg/L of the substance.

4. The method of manufacturing a semiconductor device according to claim 1, further comprising:

a step of pasting a support substrate to a front surface side of the substrate with adhesive agent before the metal mask forming step; and a step of exfoliating the support substrate from the substrate after the metal mask removing step.

5. The method of manufacturing a semiconductor device according to claim 1, wherein a main component of the tapered metal mask is chromium, copper, nickel or aluminum.

6. A method of manufacturing a semiconductor device comprising:

a metal mask forming step of forming a tapered metal mask having an opening on or above a back surface of a substrate, wherein the opening exposes a predetermined part in the back surface of the substrate, and an edge portion of the opening has a forward taper to the back surface;

a dry etching step of performing, from an upper side of the tapered metal mask, dry etching on the edge portion of the opening and the substrate exposed from the opening, thereby forming a tapered groove on the substrate; and a metal mask removing step of removing the tapered metal mask, wherein the metal mask forming step includes an electroless plating to form an electroless plating film as the tapered metal mask using an electroless plating solution containing a catalyst poison so that a first concentration of the catalyst poison above an outer edge of the predetermined part in the back surface of the substrate is higher than a second concentration of the catalyst poison above a region outside the predetermined part in the back surface of the substrate whereby a portion of the electroless plating film above the outer edge of the predetermined part is grown to have the forward taper, and the tapered metal mask is provided with a plurality of the openings adjacent to each other, and a first portion sandwiched by the plurality of openings in the tapered metal mask is formed to be thinner than a second portion other than the first portion in the tapered metal mask, and in the dry etching step, the dry etching is continued even after the first portion disappears through the plurality of openings, whereby a first region just under the first portion on the back surface is made thinner than a second region just under the second portion on the back surface.

7. The method of manufacturing a semiconductor device according to claim 1, wherein a material of the substrate is a compound semiconductor or $Al_2O_3$.

8. The method of manufacturing a semiconductor device according to claim 1, wherein a material of the substrate is a difficult-to-etch material having an etching rate of 0.1 to 1 μm/min in dry etching using a resist.

9. The method of manufacturing a semiconductor device according to claim 1, wherein a material of the substrate is a single element semiconductor.

10. The method of manufacturing a semiconductor device according to claim 1, wherein the tapered metal mask is provided with a plurality of the openings adjacent to each other, and a first portion sandwiched by the plurality of openings in the tapered metal mask is formed to be thinner than a second portion other than the first portion in the tapered metal mask.

* * * * *